United States Patent
Kushnir

(10) Patent No.: US 10,693,687 B1
(45) Date of Patent: Jun. 23, 2020

(54) INTERMEDIATE FREQUENCY ON CHIP (IFOC) SYSTEM

(71) Applicant: Intel Corporation, Santa Clara, CA (US)

(72) Inventor: Igal Kushnir, Hod-Hasharon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/367,548

(22) Filed: Mar. 28, 2019

(51) Int. Cl.
| | | |
|---|---|---|
| H04B 1/04 | (2006.01) |
| H04L 27/00 | (2006.01) |
| H04L 25/03 | (2006.01) |
| H04B 7/0413 | (2017.01) |

(52) U.S. Cl.
CPC .......... *H04L 27/0014* (2013.01); *H04B 1/04* (2013.01); *H04L 25/03828* (2013.01); *H04B 7/0413* (2013.01); *H04L 2027/0018* (2013.01); *H04L 2027/0083* (2013.01)

(58) Field of Classification Search
CPC ...... H04B 1/04; H04B 7/0413; H04B 1/0028; H04B 1/0032; H04B 1/0007; H04L 27/0014; H04L 25/03828; H04L 2027/0018; H04L 2027/0083
See application file for complete search history.

(56) References Cited

U.S. PATENT DOCUMENTS

| | | | | |
|---|---|---|---|---|
| 7,528,754 B1* | 5/2009 | Bakkaloglu | ........... | H03M 3/504 341/136 |
| 7,636,562 B1* | 12/2009 | Wong | ..................... | H03D 7/161 455/283 |
| 2004/0208590 A1* | 10/2004 | Nabors | ............ | H04B 10/25752 398/115 |
| 2008/0139126 A1* | 6/2008 | Lee | ........................... | H04L 1/20 455/67.11 |
| 2011/0299635 A1* | 12/2011 | Mirzaei | ................... | H04L 27/34 375/340 |
| 2016/0204826 A1* | 7/2016 | Feher | ..................... | H04L 1/0003 375/142 |
| 2018/0026689 A1* | 1/2018 | Khan | .................... | H04B 7/0413 375/295 |
| 2018/0180713 A1* | 6/2018 | Cohen | ..................... | G01S 7/006 |
| 2019/0222326 A1* | 7/2019 | Dunworth | ................ | H04B 1/04 |

* cited by examiner

*Primary Examiner* — Andrew Wendell
(74) *Attorney, Agent, or Firm* — Schiff Hardin LLP

(57) ABSTRACT

Techniques are disclosed implementing a radio partitioning architecture using multiple data streams over a single coaxial cable that does not require external RF filtering. This provides a flexible frequency scheme (e.g., using IF frequency adjustment) that enables the avoidance of Wi-Fi and LTE harmonics. The techniques include leveraging baseband filtering, which may be integrated with the radio head in a common radio frequency intergraded circuit (RFIC).

20 Claims, 17 Drawing Sheets

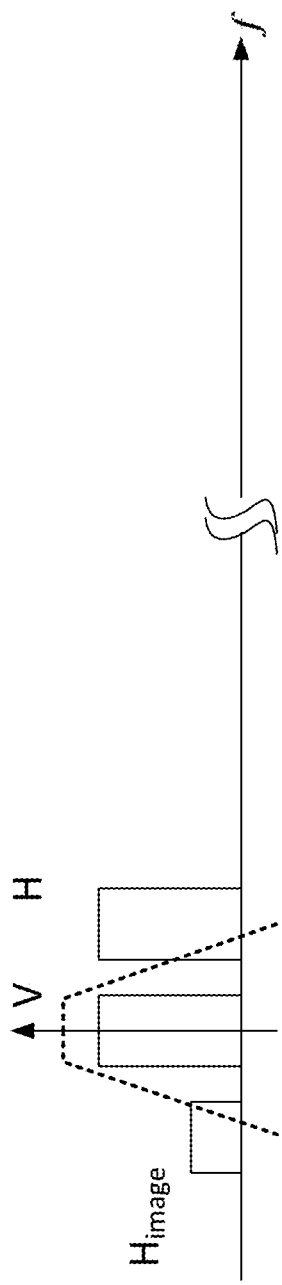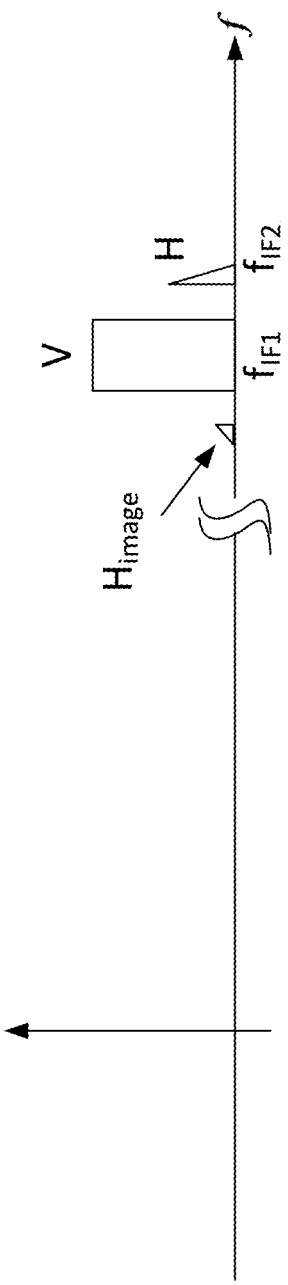

US 10,693,687 B1

INTERMEDIATE FREQUENCY ON CHIP (IFOC) SYSTEM

TECHNICAL FIELD

Aspects described herein generally relate to wireless radio architectures and, more particularly, to wireless radio architectures implementing intermediate frequency on chip (IFoC).

BACKGROUND

Wireless radios, particularly those used for multiple-input multiple-output (MIMO) systems, may utilize a single baseband module in conjunction with multiple phased array radio frequency (RF) heads. These multiple RF heads may include components associated with the RF transmitters and RF receivers, which may be coupled to an antenna array to facilitate the transmission and reception of wireless data. Each of the RF heads typically includes a number of transmit and receive chains dedicated to each frequency band of operation. Thus, to enable wireless communications with additional frequency bands, additional RF heads are added to the system. The additional radio heads are generally connected to the baseband module via coaxial cables. However, the coaxial cables, along with their accompanying RF connectors, are large and expensive, and their placement as part of a mobile device may thus be difficult.

BRIEF DESCRIPTION OF THE DRAWINGS/FIGURES

The accompanying drawings, which are incorporated herein and form a part of the specification, illustrate the aspects of the present disclosure and, together with the description, and further serve to explain the principles of the aspects and to enable a person skilled in the pertinent art to make and use the aspects.

FIGS. 4A-4E illustrate example spectral graphs in accordance with the use of bandpass filtering for RF heads using a single coaxial cable to carry two data streams at different IF frequencies.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
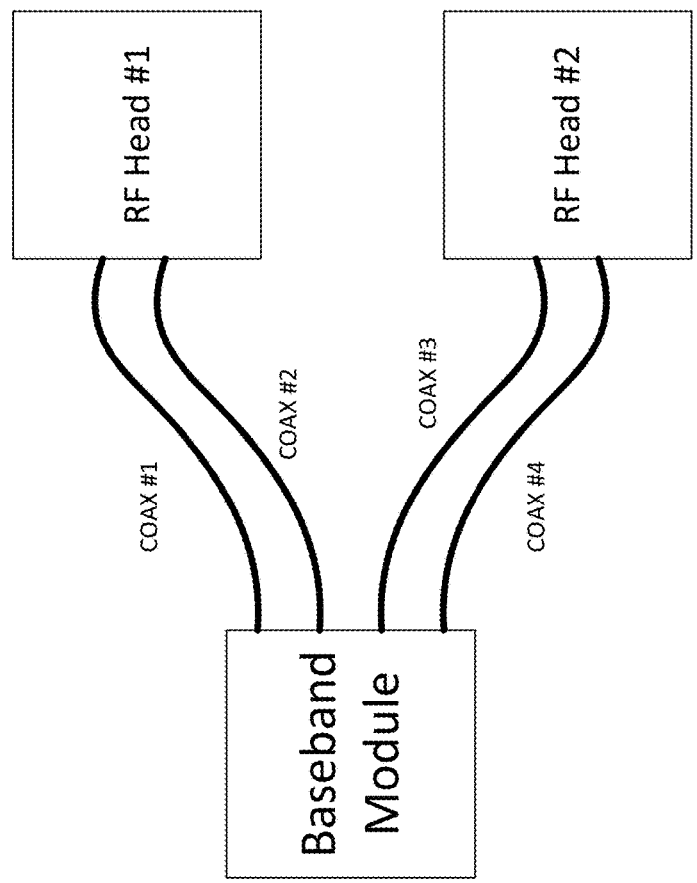
FIG. 1 illustrates a block diagram of a conventional wireless radio architecture, with each coaxial cable carrying a single data stream.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

As mentioned above, RF heads are typically connected to the baseband module via a coaxial cable. In some wireless systems (e.g., mmWave systems) each coaxial cable may pass a single data steam. Current market demands, however, typically require each RF head to transmit or receive four or more separate data streams. For example, the advent of interband channel aggregation (CA) for mmWave systems uses vertical and horizontal polarizations for both 28 GHz and 39 GHz frequencies when CA is implemented.

There have been several previous solutions to address this issue. One solution, includes using a separate coaxial cable for each unique data stream. Another solution uses a single coaxial cable for a single RF head, and implements TX/RX switching circuitry such that the data is transmitted and received via the same coaxial cable. Additional coaxial cables and RF heads are generally used when additional TX/RX data streams are needed. However, as noted above, both of these solutions still require the use of coaxial cables and their accompanying connectors, which are large and expensive, and the use of more than one coaxial cable adds unwanted cost to the wireless system and also sacrifices valuable space.

Market and consumer demand for smaller devices have driven a reduction in the number of coaxial cables used in a wireless system. To meet these demands, some wireless systems have been designed with coaxial cables that carry more than one data stream between the baseband module and the RF head(s). However, passing multiple data steams over the same cable requires the use of multiple local oscillator (LO) frequencies to up-convert (in the TX path) or down-covert (in the RX path). Moreover, before the up/down conversion it must be ensured that the data streams have the proper spectral separation to avoid spectral emissions violating regulations (e.g., FCC/ETSI) (in the TX path), or jamming adjacent channels in the RX path. As further discussed below with reference to FIG. 3B, the filtering in this case is generally done using high-Q RF filters, which are external, large, and expensive devices and, as a result, also difficult to fit into a small dense RFEM.

Therefore, to address these issues, the aspects described herein implement a radio partitioning architecture that uses multiple data streams over a single coaxial cable and does not require external RF filtering. This also provides a flexible frequency scheme that enables the avoidance of Wi-Fi and LTE harmonics. As further discussed below, this is achieved by leveraging baseband filtering, which may be implemented in the same RFIC with the radio head, for example.

The aspects described herein may be applied equally to both the TX path and the RX path. For example, consider a transmitter generating vertical (V) and horizontal (H) data streams via the baseband module, each one at a different intermediate frequency (IF). In accordance with the aspects described herein, the data streams may be combined into a single coaxial cable that is coupled to an RF head. Prior to up-converting these two data streams to the final, RF frequency for data transmission, each data stream is first separated. The aspects described in further detail below enable the down-conversion of each separate data stream (V and H polarizations) to the baseband such that the unwanted channel may be filtered in the baseband domain. Upon filtering, the resulting filtered signal may be up-converted back to the IF frequency, or up-converted directly to the higher RF frequency used for data transmission, in various aspects.

Moreover, an issue with I/Q modulators in the TX (or I/Q demodulators in the RX) in both the baseband module and the RF head (as well as the RF interface in between) is that the architecture produces two sources for I/Q mismatch among the different I and Q data branches. The aspects described herein further address this issue by setting the IF frequencies in the baseband module and the RF head so that the total I/Q mismatch is combined (e.g., with no frequency error or "rotation" between them). In this way, any I/Q mismatches may be effectively measured by sampling the signal in the RF head, and I/Q mismatch correction may be appropriately generated in the baseband module (e.g., via pre-distortion).

Furthermore, by performing filtering in the baseband domain versus the RF domain, the aspects described herein enable the use of an adjustable IF frequency, which helps avoid known blocker signals such as LTE and Wi-Fi harmonics. For example, when RF filtering is implemented in conventional approaches, the filters are difficult to tune. In contrast, the use of baseband filtering involves a more straightforward design approach in that a new IF frequency may be set that ensures the data is subsequently down-converted to baseband. The aspects described herein thus allow for the implementation of a single coaxial cable that may pass multiple concurrent data streams, which may be particularly useful, for example, for mm-Wave frequency applications.

FIG. 1 illustrates a block diagram of a conventional wireless radio architecture, with each coaxial cable carrying a single data stream. In the example shown in FIG. 1, the conventional wireless radio architecture 100 is configured to work with four separate data streams, with two data streams per RF head. Continuing this example, each of the RF heads shown in FIG. 1 may be configured to support a wireless communications protocol by transmitting and receiving data in accordance with a particular frequency or band of frequencies. In the example shown in FIG. 1, each of the four coaxial cables may carry a separate data stream associated with data transmission and reception for a different frequency for each RF head, thus requiring four separate coaxial cables (i.e., TX and RX for RF head 1 at one frequency, and TX and RX for RF head 2 at another frequency).

Figure 2A:
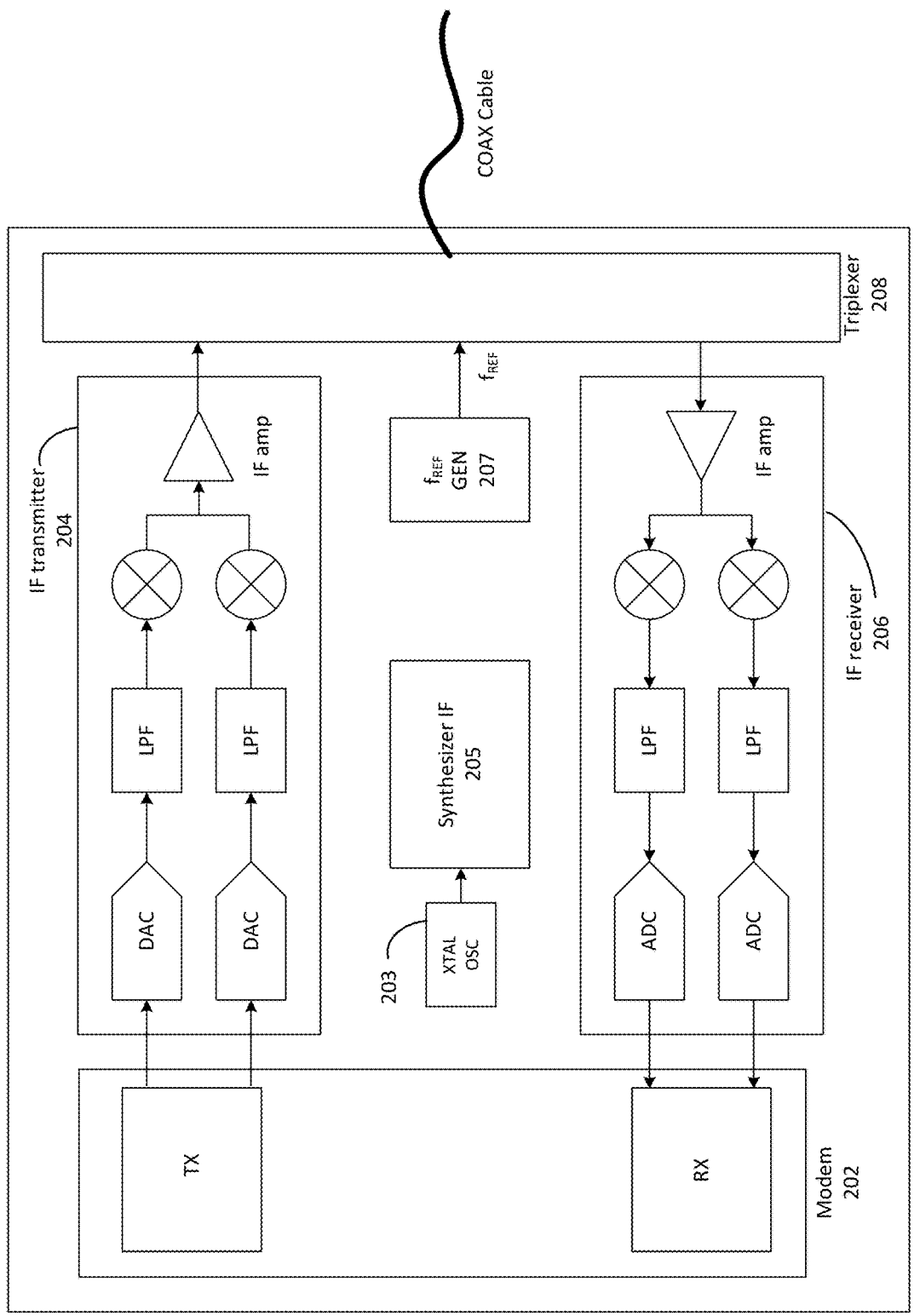
FIGS. 2A-2B illustrate a detailed block diagram of a conventional IFoC phased array system with a single coaxial cable between the baseband module and the RF head, which carries a single data stream.
Figure 2B:
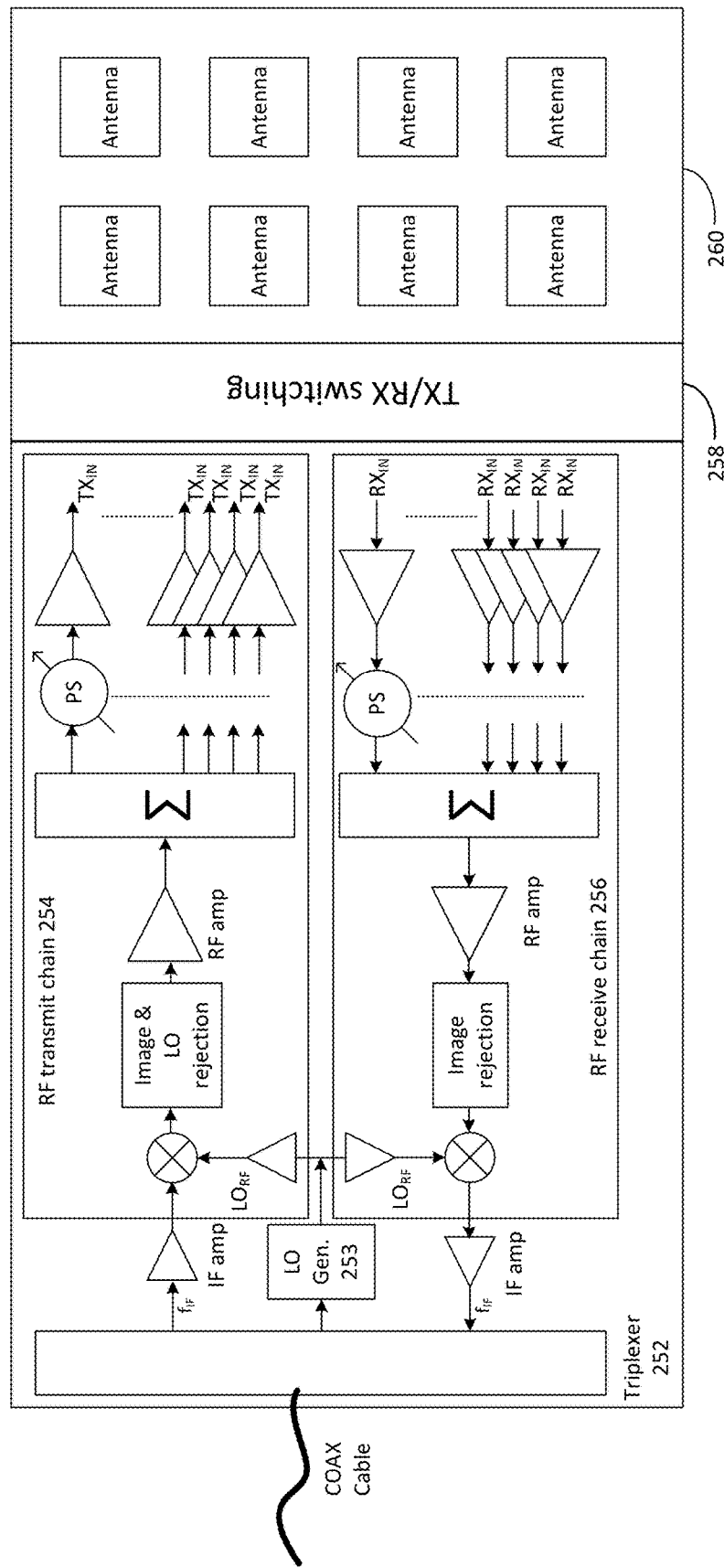

FIGS. 2A-2B illustrate a detailed block diagram of a conventional IFoC phased array system with a single coaxial cable between the baseband module and the RF head, which carries a single data stream. The conventional IFoC architecture 200 shown in FIGS. 2A-2B improves upon the conventional wireless radio architecture 100 shown in FIG. 1 via the use of TX/RX switching, allowing a single coaxial cable to be time-multiplexed for both the transmitted and received data streams. The conventional IFoC architecture 200 may be generally divided into a baseband module 200, which is shown in FIG. 2A, and an RF head 250, which is shown in FIG. 2B. The baseband module 200 is coupled to the RF head 250 in this example via a single coaxial cable.

The baseband module 200 may include a modem 202, which is configured to process baseband data to be modulated and demodulated in accordance with a particular communication protocol, and may include in-phase (I) baseband data and quadrature-phase (Q) baseband data for an I/Q-based modulation and de-modulation architecture, which is used as the example throughout this disclosure. Thus, the modem 202 may include any suitable number a baseband processors or other suitable hardware processors, which may act in conjunction with software to facilitate baseband data generation, encoding, and decoding in accordance with wirelessly-transmitted and received data. The baseband module may support such wireless communications in accordance with known techniques, for example.

Thus, the modem 202 may include various circuit and/or processor components represented in a block format, which includes a TX block coupled to an IF transmitter block 204, and an RX block coupled to an IF receiver block 206. The TX block provides digitized in-phase baseband data and digitized quadrature-phase baseband data to the IF transmitter block 204 along two separate chains or paths as shown in FIG. 2A. The digitized in-phase baseband data and digitized quadrature-phase baseband data are then converted to analog in-phase baseband data and analog quadrature-phase baseband data via each of the respective digital-to-analog converters (DACs), passed through the low-pass filters (LPFs), and up-converted to an IF frequency via each of the mixers as shown. The up-converted and filtered analog in-phase baseband data and filtered analog quadrature-phase baseband data are then combined into a single up-converted analog data stream that includes the I and Q baseband data via the IF amplifier, and the combined I and Q signal is then coupled to the triplexer 208 to be sent via the coaxial cable as shown in FIG. 2A.

The IF receiver block 206 and the RX block of the modem 202 shown in FIG. 2A function in a reciprocal manner as the TX block and IF transmitter block 204 described above. In particular, the coaxial cable carries a combined analog data stream associated with the I and Q data signals wirelessly received from the RF head 250, which have been down-converted to the IF frequency. The IF receiver block 206 then amplifies the combined received signal via the IF amplifier as shown in FIG. 2A, and the amplified received analog data stream is then down-converted to baseband via the in-phase and quadrature-phase paths via each respective mixer, filtered via the LPFs, and digitized via the analog-to-digital converters. The modem 202 may then process the digitized in-phase baseband data and digitized quadrature-phase baseband data to extract and process the wirelessly-received data.

The baseband module 200 also includes an IF generator or synthesizer 205, which uses a crystal oscillator 203 or other suitable, stable frequency source (e.g., a phase-locked loop (PLL) or a digital PLL (DPLL)). Although not shown in FIG. 2A for brevity, the IF generator 205 may provide an IF frequency that may be used as a local oscillator (LO) via the mixers in each of the IF transmitter block 204 and the IF receiver block 206 to provide up-conversion and down-conversion of signals, respectively, as discussed above. The baseband module 200 may further include a reference frequency generator 207, which generates a reference frequency used by the RF head 250, as further discussed below. Thus, the triplexer 208 may enable the coaxial cable to concurrently carry a single data stream at a particular time (i.e., a transmit data stream or a receive data stream) as well as other reference signals that may be utilized by the RF head 250 (e.g., the reference frequency signal $f_{REF}$).

The RF head 250 is shown in FIG. 2B, which includes a triplexer 252 that couples a single data stream via the coaxial cable at a particular time (e.g., RX or TX, depending upon the state of the TX/RX switching block 258) to and from the baseband module 200, along with any other signals (e.g., reference frequency signals) used by the RF head 250. The RF head 250 also includes an RF transmitter chain 254 and an RF receiver chain 256, both of which utilize a generated LO frequency via the LO generator 253. The LO generator 253 may use the reference frequency signal received from the baseband module 200, as discussed above, to generate the LO signal. The RF transmitter chain 254 may use the LO signal to provide up-conversion of the I/Q data stream received via the coaxial cable to the transmission (i.e., RF) frequency, which is first amplified using the IF amplifier as shown in FIG. 2B, and then subsequently amplified using the RF amplifier that is coupled to a combination block (denoted 2). The combination block may couple the amplified RF signal to be transmitted to any suitable number of antennas within the antenna array 260 in accordance with a phased array system to implement beamforming by applying the appropriate phases (via the adjustable phase-shifting (PS) blocks) and amplitude weightings (via the adjustable amplifiers).

Likewise, the RF receiver chain 256 may function to couple signals having the appropriate phase shifts and amplitude weighting applied to received wireless signals coupled via one or more antennas within the antenna array 260, which are when combined via a separate combination block (also denoted 2). The RF receiver chain 256 then amplifies the combined signals output from the combination block, which are downconverted from the received RF frequency to the IF frequency to form an analog IF receive data stream that is then coupled to the baseband module 200 via the coaxial cable.

The RF head 250 may have any suitable number of phase-shifters and amplifiers depending upon the number of antennas in the antenna array 260. Furthermore, the RF transmitter chain 254 and the RF receiver chain 256 may include any suitable type of image and/or LO rejection filters, processing blocks, etc., which may be of a known design, for example, as shown in FIG. 2B.

Figure 3A:
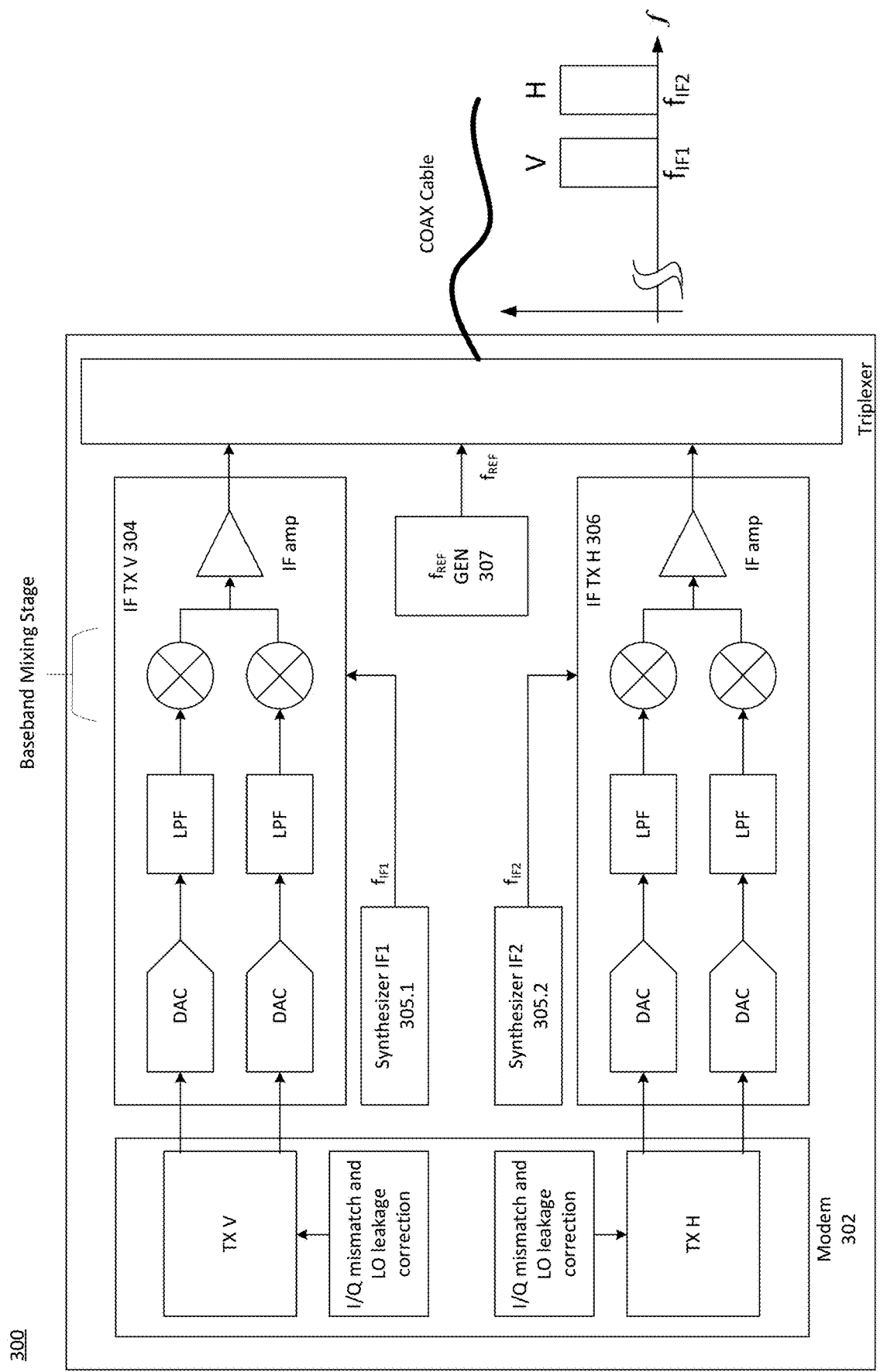
FIGS. 3A-3B illustrate a detailed block diagram of a conventional IFoC phased array system with a single coaxial cable carrying V and H polarized transmit data streams between the baseband module and the RF head.
Figure 3B:
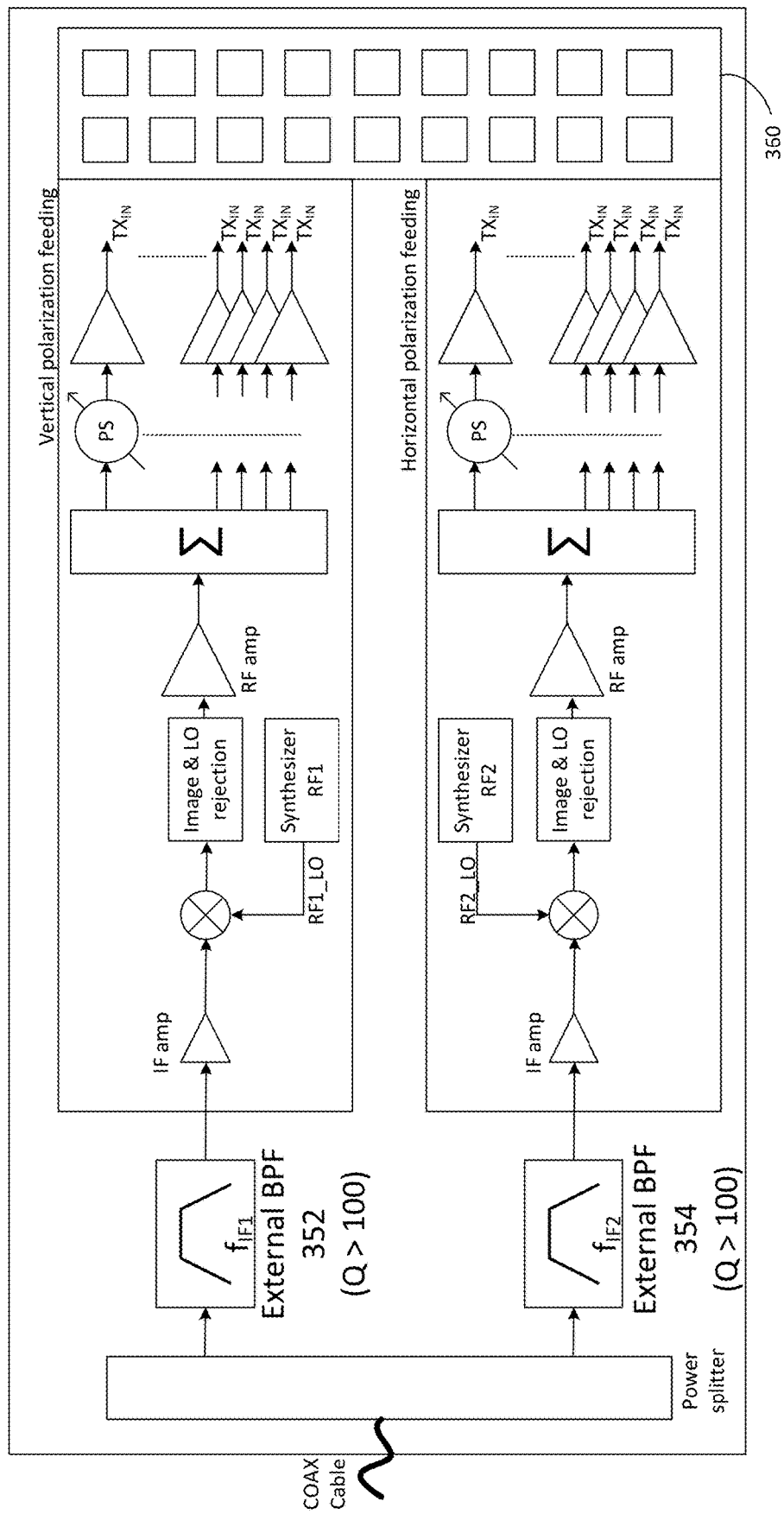

FIGS. 3A-3B illustrate a detailed block diagram of a conventional IFoC phased array system with a single coaxial cable carrying V and H polarized data streams between the baseband module and the RF head. The conventional IFoC architecture shown in FIGS. 3A-3B improves upon the conventional wireless radio architecture as shown in FIGS. 2A-2B by supporting two data streams (V and H transmit data streams) over a single coaxial cable. However, to do so, the number of transmitters and receivers is doubled, although only the transmitters are shown in FIGS. 3A-3B for brevity.

Similar to the IFoC architecture shown in FIGS. 2A-2B, the IFoC architecture shown in FIGS. 3A-3B also includes a baseband module 300 and an RF head 350, which are coupled to one another via a single coaxial cable. Of course, an additional coaxial cable would also be needed for the two receive data streams (V and H), although this is not shown in FIGS. 3A-3B for brevity. The baseband module 300 generates a transmit data stream associated with the vertical polarization at the first IF frequency IF1, and another transmit data stream associated with the horizontal polarization at the second IF frequency IF2. These transmit data streams are coupled to the RF head 350 via a coaxial cable, as illustrated in FIG. 3A via the spectral graph.

The baseband module 300 is similar to the baseband module 200 shown in FIG. 2A, with only differences being described. One difference is that the baseband module 300 includes two IF transmitter blocks 304, 306, one for each transmitted polarization data stream (V and H). Another difference is that the baseband module 300 includes separate IF generators 305.1, separate V and H baseband transmit data streams generated via the modem 302 to an IF frequency. Also, the baseband module 300, unlike the baseband module 200, includes I/Q mismatch and LO leakage correction blocks within the modem 302. These may include, for example, the generation, calculation, and/or application of known correction techniques to compensate for mismatches between the I and Q transmit paths (and receive paths, although not shown) and/or to compensate for LO leakage in each of the two IF transmitter chains 304, 306 (and receive paths (not shown)).

The receive chains for the V and H data streams may likewise include a similar layout as the transmit chains shown in FIG. 3A, with separate IF frequencies being used for the V and H receive streams for down-conversion to baseband. Again, the separate receive chains for the V and H data streams may also include I/Q mismatch and LO leakage correction blocks that allow baseband compensation processing to be performed for received data streams.

Turning now to the RF head 350, which is coupled to the baseband module 300, it is noted that the RF head 350 is similar to the RF head 250 shown in FIG. 2A, with only additional differences being described. One of these differences is the lack of a TX/RX switch in the RF head 350, as both transmit data streams are carried concurrently via the coaxial cable. Another different stems from the use of the single coaxial cable to carry both the H and V transmitted data streams. In particular, filtering is required at this stage to separate the V and H channels coupled via the coaxial cable. As shown in FIG. 3B, the quality factor (Q) of these filters needs to be relatively high (e.g., >100) and, as a result, the BPF filters 352, 354 cannot easily be implemented on silicon. Therefore, the BPFs 352, 354 are typically external, large, and expensive.

Figure 4C:
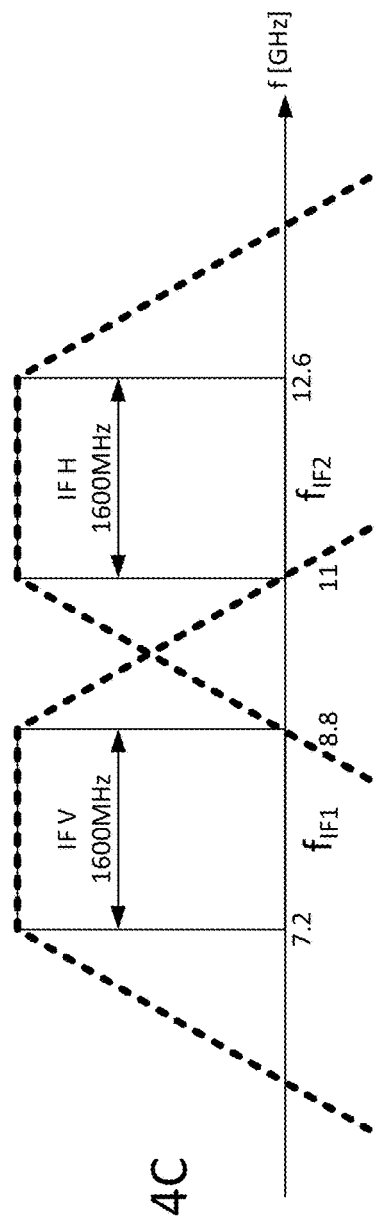

Furthermore, the RF head 350 implements separate RF LO frequencies (RF1_LO and RF2_LO) for the up-conversion of the IF V and H transmit data streams to the transmit (i.e., RF) frequency. To further clarify some other drawbacks regarding the IFoC architecture shown in FIGS. 3A-3B, FIGS. 4A-4E are provided to illustrate the typical filtering performance in this implementation. For instance, an example of the IF spectrum associated with the IF V and H transmit data streams are shown in FIG. 3A, which are provided over the coaxial cable to the RF head 350 and filtered by the BPFs 352, 354. With reference to the vertical polarization feeding path as shown in FIG. 3B, an example of the function provided by the BPF 352 is shown in FIG. 4A-4B. For instance, if the filter characteristics of the BPF 352 are not adequate (e.g., Q is too low), then a portion of the H transmit data stream may not be adequately filtered, as shown in FIG. 4B.

To provide a practical example, for a 39 GHz transmit frequency, the IF V and H transmit data streams may have a bandwidth of approximately 1600 MHz, as shown in FIG. 4C. Furthermore, the BPFs 352, 354 may be implemented as 3rd order 1 dB ripple Chebyshev BPFs with components that have Q=100. Continuing this example, the BPFs 352, 354 would provide approximately 37 dB of filtering at the band edge of the other polarization. An example result of this filtering process is shown in FIGS. 4D and 4E, which may be considered as an example spectrum of the transmit signals coupled to the antenna array 360 as shown in FIG. 3B.

Figure 4D:
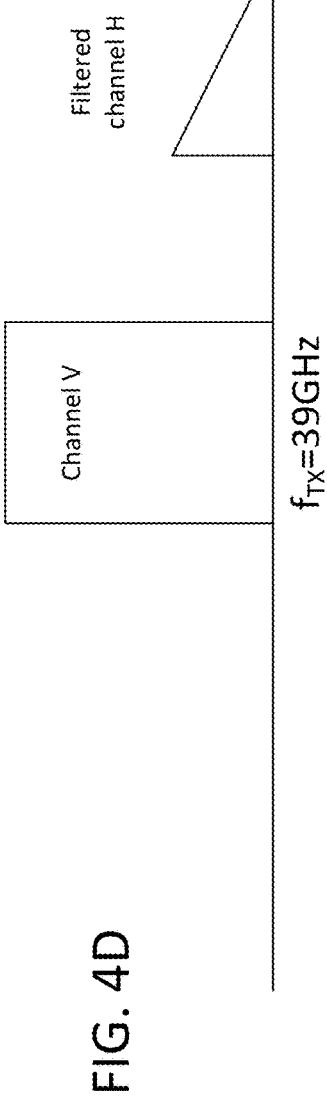
Figure 4E:
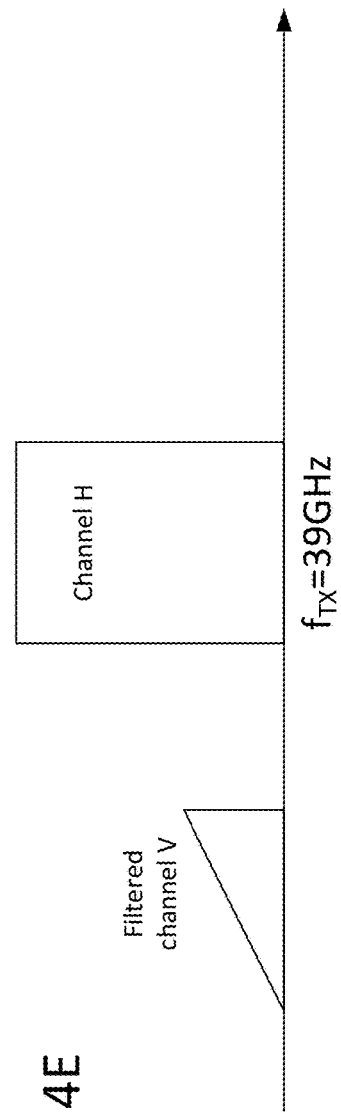

As shown in FIGS. 4D-4E, residual and unwanted energy is transmitted due to inadequate filtering via the BPFs 352, 354. Wireless radios need to be designed to comply with the transmission MASK and spectral emission regulatory requirements. Thus, to prevent exceeding regulatory requirements, the TX output power is typically lowered, reducing system performance. Furthermore, the BPFs used for such systems (e.g., the BPFs 352, 354) are non-tunable, and cannot support flexible tuning of the IF frequencies, which is desirable to avoid LTE and Wi-Fi harmonics.

Therefore, to omit the external filters, allow better IF filtering, lower spectral emissions, and enable the flexible design of the IF frequencies, aspects include the IFoC architecture as shown and described further below with reference to FIGS. 5A-5B, 7A-7B, 8A-8B, and 9A-9B.

Figure 5A:
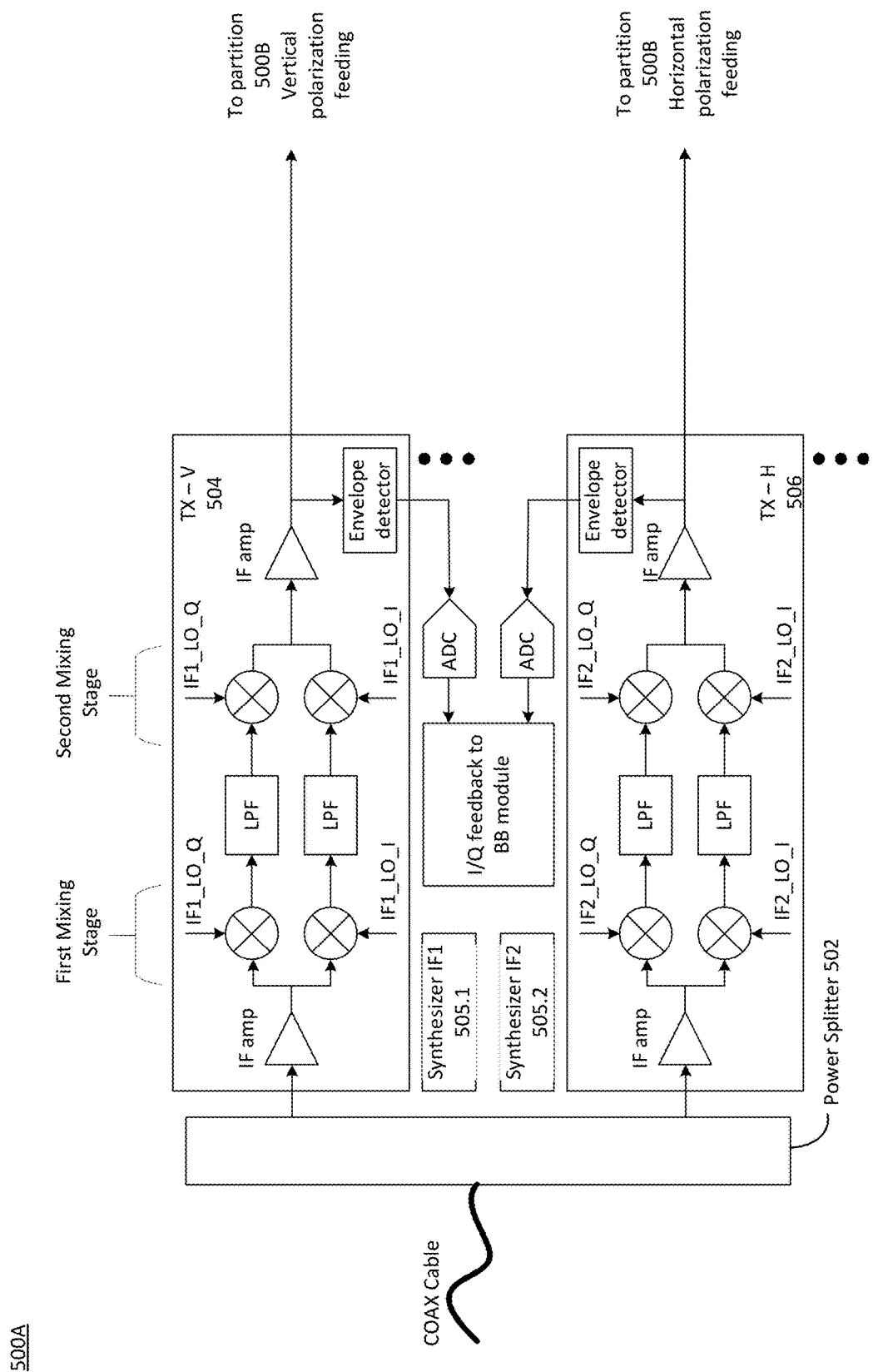
FIGS. 5A-5B illustrate an exemplary detailed block diagram of an IFoC phased array system with a single coaxial cable carrying V and H polarized transmit data streams between the baseband module and the RF head using up-conversion via an IF frequency, in accordance with an aspect of the disclosure.
Figure 5B:
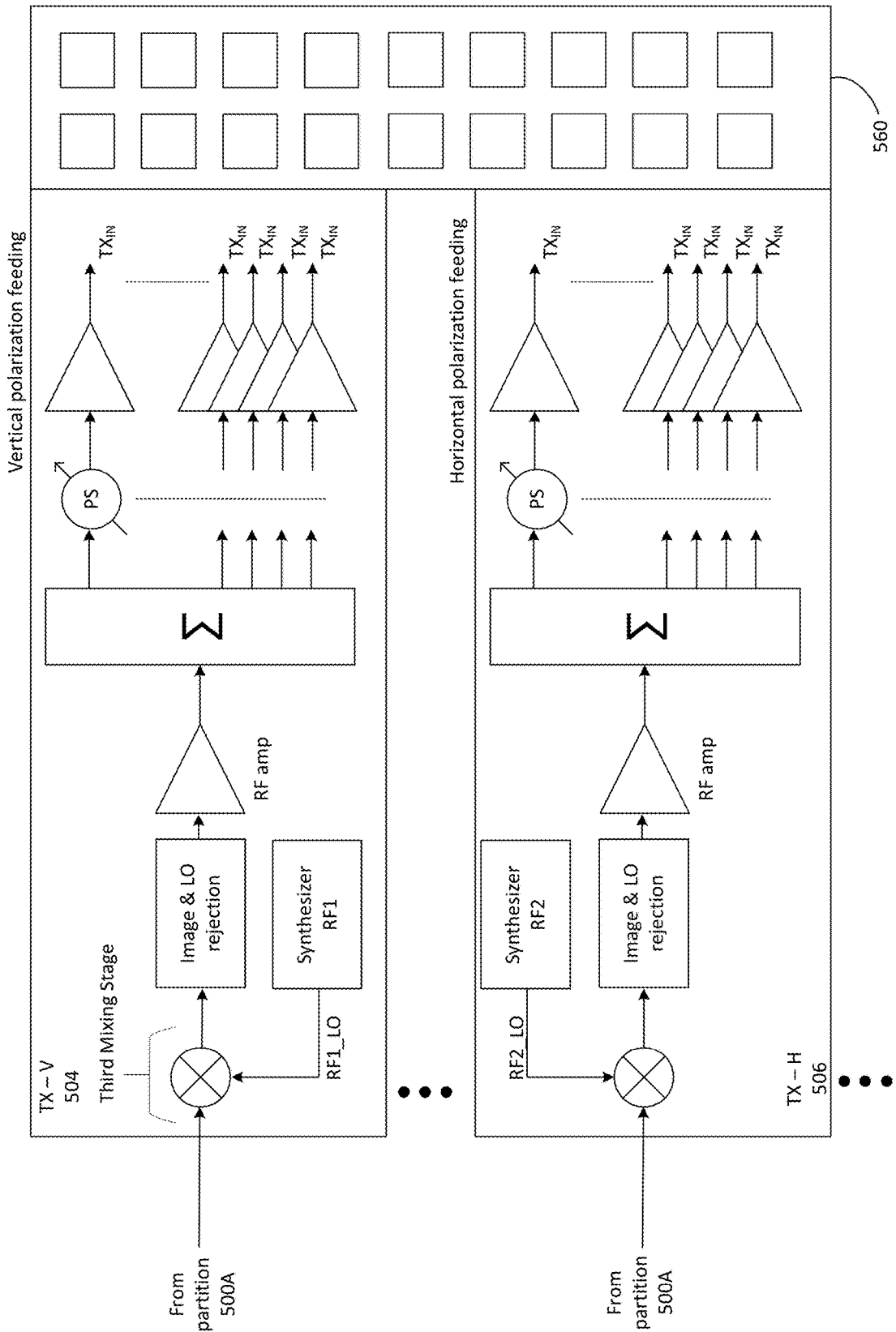

FIGS. 5A-5B illustrate an exemplary detailed block diagram of an IFoC phased array system with a single coaxial cable carrying V and H polarized data streams between the baseband module and the RF head using up-conversion via an IF frequency, in accordance with an aspect of the disclosure. In various aspects, the details of the IFoC phased array systems as shown and discussed in FIGS. 5A-5B and 7A-7B are mainly with regards to portions of the RF head. Therefore, the details of the baseband modules used in accordance with the aspects described further herein are not further described.

In various aspects, any one of the baseband modules as discussed herein, in conjunction with the radio head partitions as discussed in FIGS. 5A-5B and 7A-7B, may form part of a wireless radio configuration that improves upon the conventional designs as noted above. As an example, the RF heads shown and discussed further herein with reference to FIGS. 5A-5B and 7A-7B may be used in conjunction with any suitable type of baseband module(s). For example, a baseband module similar to the example baseband module 300 as shown and described above with reference to FIG. 3A, which uses a single coaxial cable to carry both V and H transmit data streams, may be coupled to the other end of the coaxial cable shown in FIGS. 5A and 7A.

The RF heads shown and discussed further herein with reference to FIGS. 5A-5B and 7A-7B differ from the conventional RF head configuration in several ways, which are further discussed below. One difference is with regards to the partitioning within the RF heads 500, 700. For example, the RF head 500 as shown in FIGS. 5A-5B may be generally grouped into two partitions 500A, as shown in FIG. 5A, and 500B, as shown in FIG. 5B. These two partitions 500A, 500B are split for clarity and ease of explanation regarding the details of their operation. However, aspects include the partitions 500A, 500B being implemented as part of a single RF head design, which may be incorporated on a single chip such as an RFIC, for example, or as any other suitable type of integrated circuit design.

The first partitions 500A includes a power splitter 502, which functions to split the incoming IF transmit data streams (e.g., the up-converted IF I/Q data streams at the H and V polarizations) among the vertical transmit chain 504 and the horizontal transmit chain 506. The incoming transmit data streams coupled via the coaxial cable may include, for example, a vertical polarization transmit data stream at a first IF frequency IF1, and a horizontal transmit data stream at a second frequency IF2, similar to the IF transmit data streams as shown and discussed in FIG. 3A with respect to the spectral graph.

In an aspect, the RF head 500 has an I/Q modulator architecture, and thus each of the vertical and horizontal transmit chains 504, 506 includes a separate I/Q modulator, which includes a path for the modulation of the I and Q data signals (or referred to herein as "data streams") that have been up-converted to the IF frequency via the baseband module. Aspects include each of the transmit chains 504, 506 implementing one or more IF amplifiers to amplify the combined IF I/Q transmit data streams, which are then split between each I and Q path. Within each I and Q path of the partition 500A, the respective IF I and Q transmit data streams are coupled to a first mixing stage that includes a set of I/Q mixers configured to down-convert each of the (amplified) IF I and Q data streams back to the baseband frequency. This down-conversion may include, for instance, using a LO signal that is appropriately phase-shifted for each in-phase and quadrature component signal.

In doing so, aspects include the first partition 500A of the RF head 500 performing baseband domain low-pass filtering via the LPF within each of the I and Q paths of each of the transmit chains 504, 506, as shown in FIG. 5A. In other words, by down-converting the IF signal to the baseband, aspects include the RF head 500 applying V/H separation and filtering in the baseband domain to provide a filtered baseband data signal for each I and Q data stream.

Filtering in the baseband domain is advantageous in that the filter Q specifications may be much lower compared to the use of the external bandpass filters 352, 354, which are traditionally used. Moreover, aspects include implementing the LPFs as shown in FIG. 5A in place of the BPFs that are traditionally required for filtering at higher frequencies (i.e., higher than the baseband frequency such as IF or RF). This further provides advantages by enabling the use of a less complex filter design that may utilize, for example, half the bandwidth of an equivalent bandpass filter. Upon performing baseband filtering of the I/Q transmit data streams, aspects include each of the vertical and horizontal transmit chains 504, 506 up-converting the filtered baseband signals to the IF frequency. The up-converted IF I/Q data streams are then coupled to the partition 500B, and subjected to additional signal handling and up-conversion to the transmission frequency prior to data transmission, as discussed further below.

Figure 6:
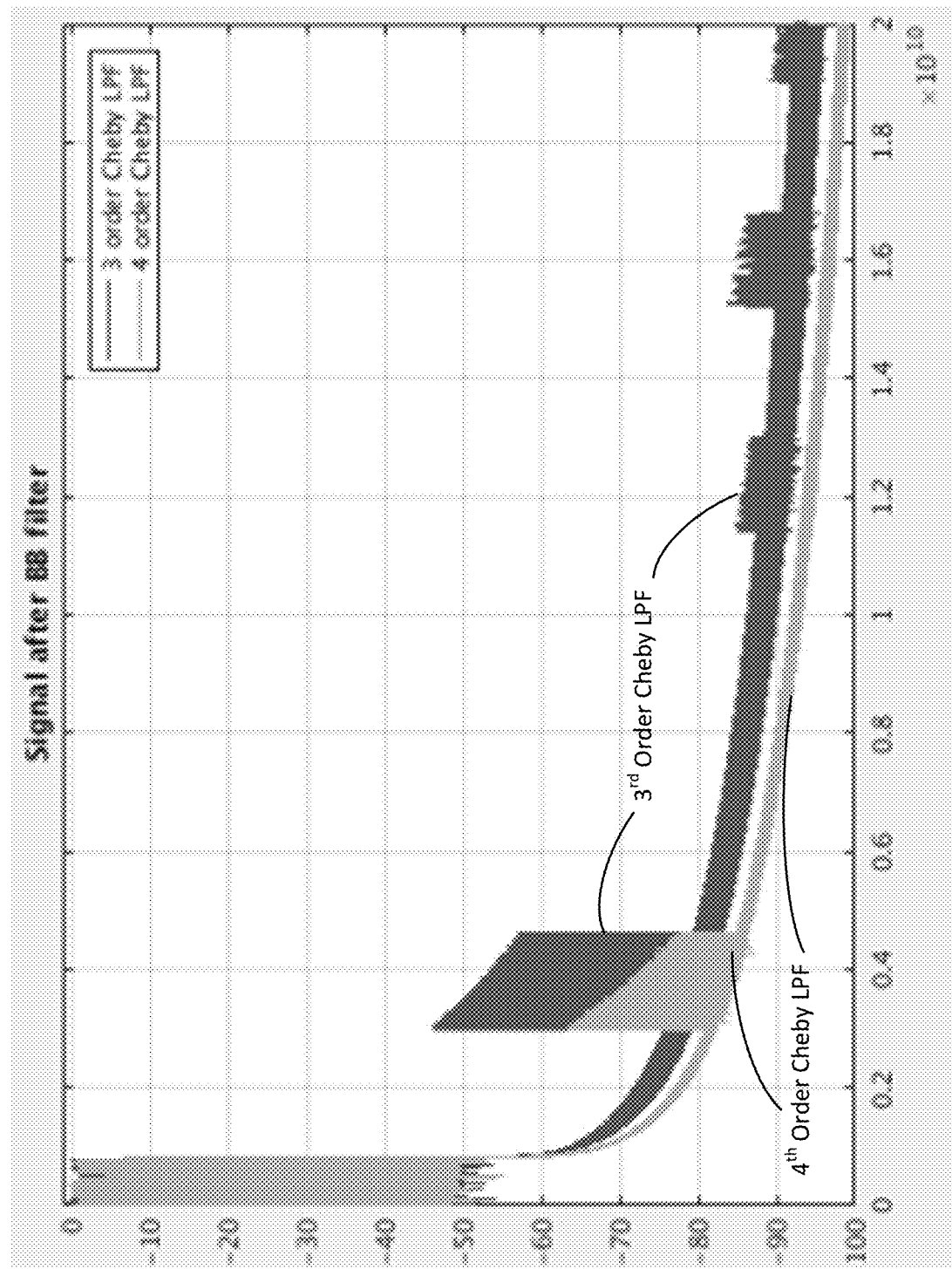
FIG. 6 illustrates an exemplary low quality (Q) factor baseband filtering result with a 3rd and 4th order Chebyshev low-pass filer (LPF), in accordance with an aspect of the disclosure.

An example simulation of the LPF output for one of the I and Q paths shown in FIG. 5A is presented in FIG. 6. The simulated signal trace shown in FIG. 6 may correspond to a signal output, for example, from a LPF filter within the I and Q paths of each of the vertical and horizontal transmit chains 504, 506, as shown in FIG. 5A. The two traces shown in FIG. 6 correspond to examples of the LPFs shown in FIG. 5A being implemented as $3^{rd}$ and $4^{th}$ order Chebyshev filters. From the traces in FIG. 6, it is demonstrated that the use of low-pass filtering in the baseband may represent an improvement of about 10 dB to 20 dB compared to typical filtering techniques performed in the higher-frequency RF domain.

As shown in FIG. 5A, the partition 500A includes two different I/Q modulators (i.e., one implemented in the vertical transmit chain 504 and another implemented in the horizontal transmit chain 506). Therefore, aspects include the RF head 500 implementing two independent sources associated with I/Q branch mismatch and LO leakage. These impairments need to be compensated to avoid transmit error vector magnitude (EVM) degradation. Typically, the main option to perform high quality I/Q mismatch and LO leakage compensation is using a digital mechanism in the baseband module, as discussed above with reference to FIG. 3A (e.g., the I/Q mismatch and LO leakage correction blocks associated with the modem 302).

In an aspect, after low-pass filtering is performed in the baseband domain, the I/Q data streams are up-converted back to the IF frequency as part of a second mixing stage and passed to the partition 500B, as shown in FIG. 5B. As another advantage, aspects of the RF head 500 utilize the same reference frequency (e.g., the reference frequency provided by the reference frequency generator 307 as shown in FIG. 3A via the coaxial cable) for the IF synthesizers 505.1, 505.2 and the IF synthesizers 305.1, 305.2. Thus, although the reference frequency may be associated with some level of frequency error, each of the IF synthesizers 305.1, 305.2, 505.1, 505.2 produces a corresponding synthesized IF frequency having substantially the same error as one another. In other words, the amount of frequency error associated with the up-conversion of the I/Q data streams fed to the partition 500A via the coaxial cable is the same amount of frequency error associated with the down-conversion of the IF I/Q data signals back to baseband (in the first mixing stage) prior to performing low-pass filtering, which is the same amount of frequency error associated with the re up-conversion of the baseband I/Q data signals to the IF frequency (in the second mixing stage) that are coupled to the second partition 500B, which is further discussed below.

Furthermore, because no additional frequency error is introduced via the down-conversion of the IF signal at the partition 500A, the baseband I/Q data streams that are filtered via the LPFs may have substantially the same frequency error as the originally-generated baseband I/Q data signals. In this way, by using the same reference frequency, the I/Q error and LO leakage in the baseband module and the RF head 500 do not "stack," or compound with one another. As a result, any I/Q error and LO leakage attributable to both the baseband module and the RF head 500 may be aggregated as a single I/Q and LO leakage impairment calculation. In an aspect, this impairment (e.g., the overall contribution of the I/Q branch mismatch and the LO leakage) may be measured at the output of each of the transmit chains 504, 506 (e.g., at the IF amplifier output of each of the vertical and horizontal transmit chains 504, 506 after up-conversion back to the IF).

The impairment measurements may be performed in accordance with any suitable techniques, such as the envelope detectors shown in FIG. 5A by way of example and not limitation. The signal characteristics measured in this manner may thus identify the overall impairments (e.g., I/Q imbalance and LO leakage) attributable to the baseband module and the portion 500A of the RF head 500. This measured impairment data may then be provided as feedback to the baseband module using any suitable or known means. For example, the impairment feedback data may be transmitted using the control channel (e.g., a real-time control (RTC) channel), or via the coaxial cable using one or more of the receive chains (not shown). When transmitted using the receive chains, aspects include doing so when calibrating each transmit chain 504, 506 (e.g., for the TX-V chain 504, an RX-H path (not shown) would pass the measured data as feedback using the IF2 frequency, and vice versa).

Furthermore, because the IF synthesizers that are used in the baseband module 300 and the RF head 500 are used for both the down-conversion and up-conversion of the I/Q data streams, the delay between the up and down conversion is substantially small in magnitude. As a result, the phase noise of these IF synthesizers has very low impact on the on the transmitted error vector magnitude (EVM). Therefore, as an added advantage, low power and/or low quality IF synthesizers can be implemented in accordance with the IFoC systems described herein.

Moreover, the IF synthesizers and/or LPFs as shown and described with reference to FIGS. 5A-5B may be dynamically tunable and/or adjustable based upon the measured impairment data. For instance, the IF synthesizers 305.1, 305.2, 505.1, and/or 505.2 may vary the IF frequency, which in turn shifts the up-converted IF frequency used by the baseband module and the partition 500A for the up-conversion and down-conversion of the I/Q data streams. In this way, the aspects described herein enable the use of an adjustable IF frequency to prevent the generation of and/or receipt of known blocker signals, such as LTE and Wi-Fi harmonics, for example.

Furthermore, because the LPFs implemented by the partition 500A have a less complex design than bandpass filters and work in the baseband domain, aspects also include the LPFs having respective tuning parameters that may be dynamically tuned based upon known desired results to be achieved (e.g., to filter known spurs). Additionally or alternatively, the measured impairment data may identify such blocker signals, sources of interference, etc., and this information may be utilized to appropriately adjust the IF frequency and/or the LPF filter parameters. Additionally or alternatively, aspects include the filter parameters associated with the image and LO rejection blocks as shown in FIG. 5B being dynamically adjusted in response to the measured impairment data, or using other data or information regarding the operating environment. The dynamic adjustment of the IF frequency, the image and LO rejection block parameters, and/or the LPF parameters may be performed, for instance, by the baseband module 300 or another suitable computer processor (e.g., as discussed herein with reference to FIG. 10).

In this example of a transmitter configuration, the partition 500B may operate in a substantially similar manner as the transmit chains shown in FIG. 3B. For example, the transmit chains 504, 506 shown in FIG. 5B may be identified with, operate, and be configured in a substantially similar or identical manner as the vertical and horizontal polarization paths shown in FIG. 3B. Therefore, only differences between the components of these different transmit chains will be further described. One difference between the architectures shown in FIGS. 3B and 5B is the implementation of the IF amplifier stage in FIG. 3B, whereas this is performed in the partition 500A and not in the partition 500B for the RF head 500 as shown in FIG. 5A. However, in other aspects the IF amplifier stage(s) implemented via the RF head 500 may be included in either partition 500A or 500B, or both. In any event, the transmit chains 504, 506 in partition 500B may be configured to up-convert the I/Q data streams from the IF frequency to the RF frequency used for data transmission. As shown in FIG. 5B, this may be performed via the use of a third mixing stage that utilizes a LO signal at the appropriate RF frequency.

Again, the aspects described herein with reference FIGS. 5A-5B utilize two up-conversion stages. In particular, the first of these is performed via the baseband module (e.g., the baseband mixing stage), as shown in FIG. 3A. The second IF up-conversion is then performed within the first RF head partition 500A to restore the I/Q data streams to the IF frequency (in the second mixing stage) after down-conversion (in the first mixing stage) and low-pass filtering has been performed in the baseband domain. This dual up-conversion technique is advantageous, as noted above, because the IF frequency synthesizers may utilize the same reference frequency and, as a result, low power, low quality, and low cost IF synthesizers can be implemented. Doing so, however, requires the use of additional die area due to these additional mixing stages. Thus, in other aspects as shown and discussed below with reference to FIGS. 7A-7B, the second mixing stage in the first partition 500A and the third mixing stage in the second partition 500B may be replaced with a single mixing stage that provides a direct up-conversion from baseband to the RF transmission frequency.

Figure 7A:
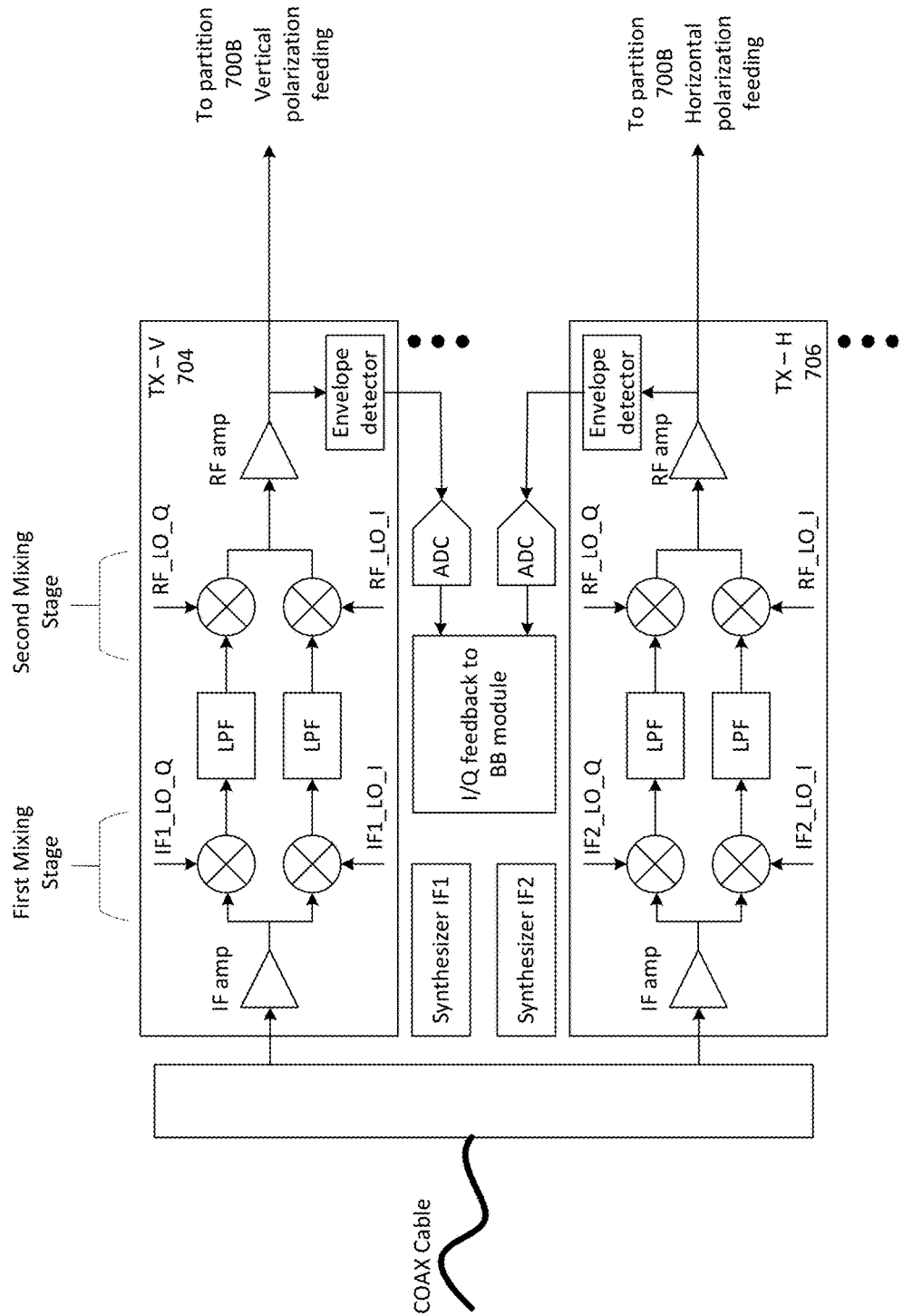
FIGS. 7A-7B illustrate an exemplary detailed block diagram of an IFoC phased array system with a single coaxial cable carrying V and H polarized transmit data streams between the baseband module and the RF head using direct up-conversion to the transmit frequency, in accordance with an aspect of the disclosure.
Figure 7B:
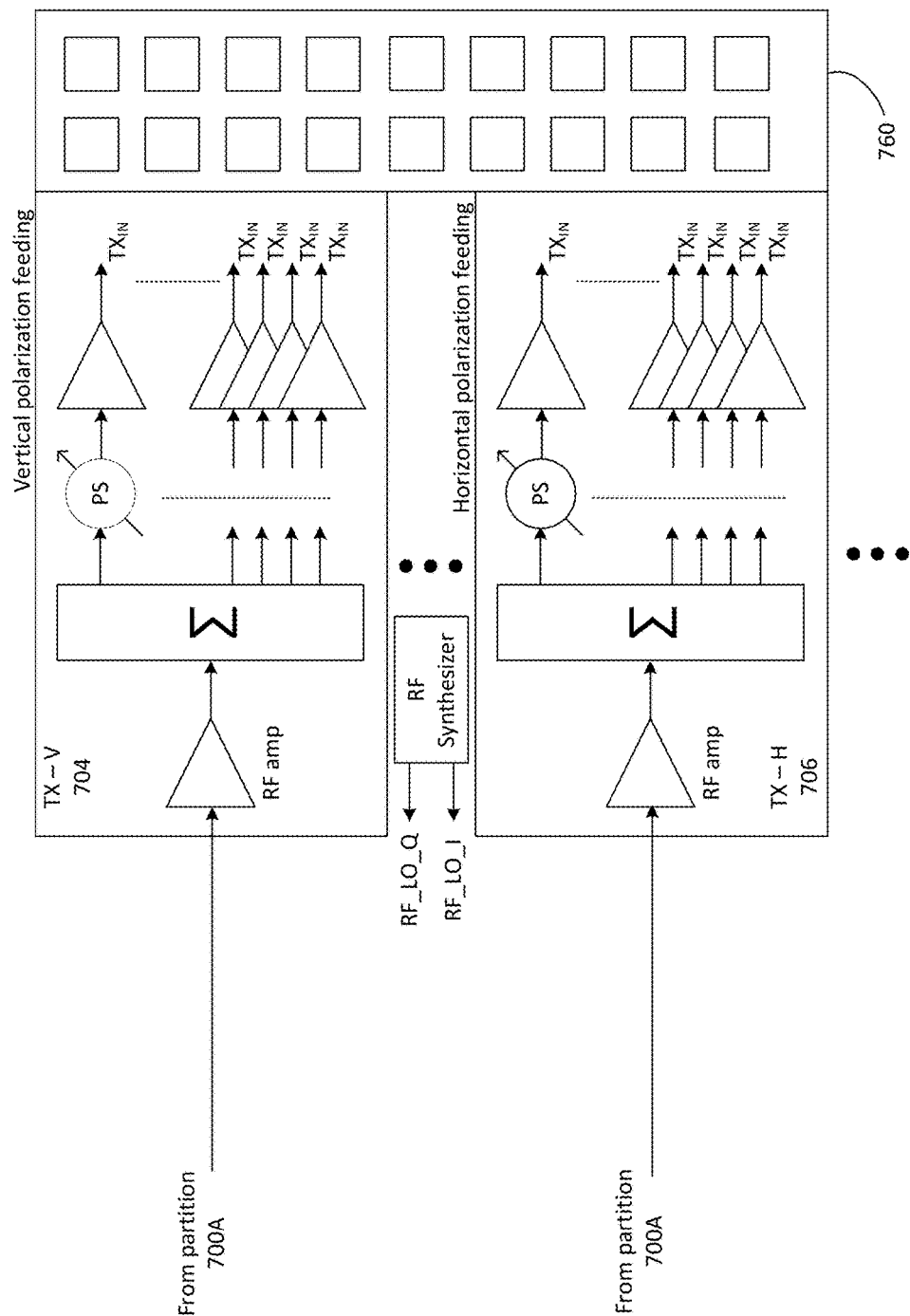

For example, as shown in FIG. 7A-7B, aspects include the RF head 700 implementing two partitions 700A and 700B, which are similar to the partitions 500A and 500B as discussed herein with reference to FIGS. 5A-5B, and thus only differences between the RF head 500 and the RF head 700 will be further described. For example, the RF head 700 may also be coupled to a baseband module via a coaxial cable (e.g., baseband module 300 as shown in FIG. 3A), which carries a combined I/Q data stream at the IF frequency to the vertical and horizontal transmit chains 704, 706. In the example aspect shown in FIG. 7A, however, the partition 700A performs a direct RF up-conversion stage as opposed to the second IF up-conversion stage performed by the partition 500A as shown in FIG. 5A.

To do so, the first partition 700A utilizes RF LO frequencies for the mixer inputs at the I and Q branches instead of the IF frequencies used in the first partition 500A. Furthermore, the first partition 700A implements RF amplifiers instead of IF amplifiers at the output of the second up-conversion stage (i.e., the second mixing stage). The impairments as noted above for the I/Q branches and the LO frequencies with respect to the RF head 500 may also be measured at the output of the RF amplifiers for the RF head 700. And, similar to the RF head 500, aspects include the baseband module 300 utilizing the measured impairment data (or other suitable information) to appropriately compensate for impairments in the modem 302 via the I/Q mismatch and LO leakage correction, as well as dynamically adjusting the IF frequency signals used for IF up- and down-conversion and/or the LPF filter parameters.

Again, the RF head 700 directly up-converts the baseband signal (after low-pass filtering) to the transmit frequency. In this example, both the vertical and the horizontal polarization chains 704, 706 use the same RF synthesizer, as shown in FIG. 7B. Of course, because each I and Q data stream mixer utilizes a separate LO signal (i.e., RF_LO_I and RF_LO_Q) as shown in FIG. 7A, the RF synthesizer generates separate RF LO signals having the appropriate phase shift for I/Q modulation, as shown in FIG. 7B. By utilizing the same RF synthesizer in this manner, the number of RF synthesizers used in the RF head 700 are reduced by half compared to those used by the RF head 500. For instance, the RF head 500 uses two separate RF synthesizers RF1 and RF2 in the second partition 500B to generate two distinct RF LO signals RF1_LO and RF2_LO. Another added advantage of the use of a single RF synthesizer is the elimination of the image and LO rejection filter as shown in FIG. 5B. Such image and LO rejection filters take up additional die area, and thus their elimination may further save die area.

Figure 8A:
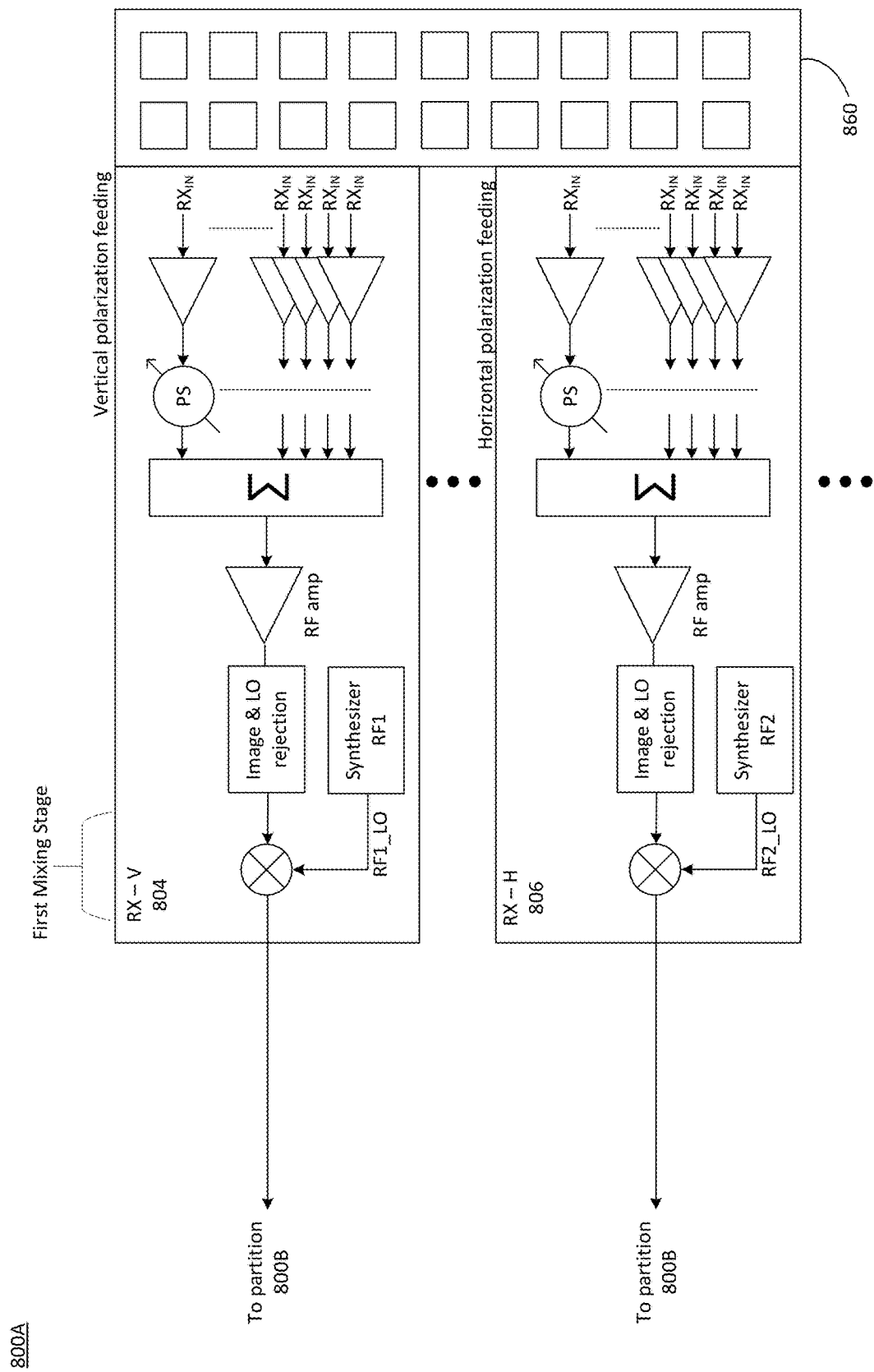
FIGS. 8A-8B illustrate an exemplary detailed block diagram of an IFoC phased array system with a single coaxial cable carrying V and H polarized receive data streams between the RF head and the baseband module using down-conversion via an IF frequency, in accordance with an aspect of the disclosure.
Figure 8B:
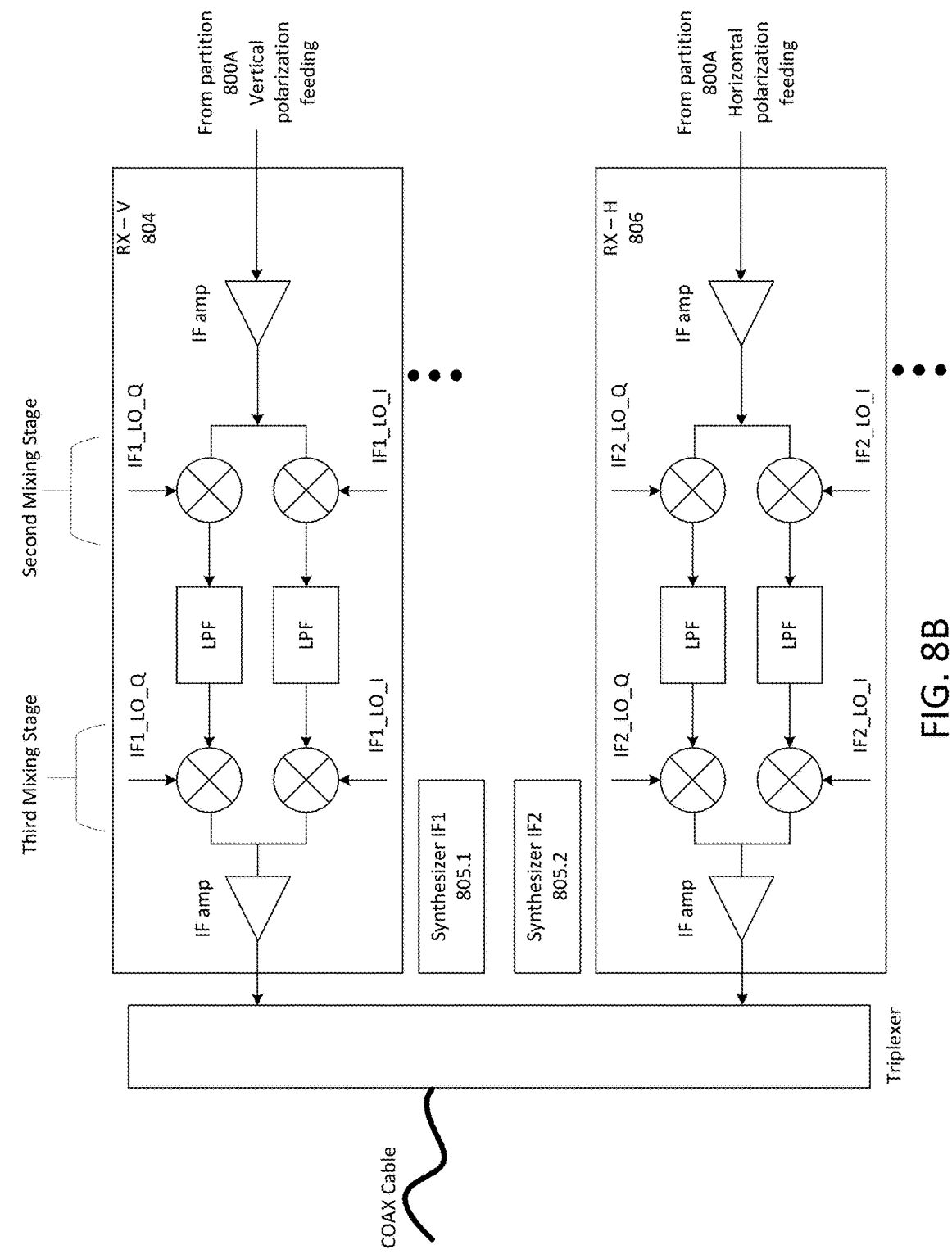

FIGS. 8A-8B illustrate an exemplary detailed block diagram of an IFoC phased array system with a single coaxial cable carrying V and H polarized receive data streams between the RF head and the baseband module using down-conversion via an IF frequency, in accordance with an aspect of the disclosure. As discussed above with reference to the transmit chains in FIGS. 5A-5B and 7A-7B, the details of the IFoC phased array systems with regards to the receive chain architecture as shown and discussed in FIGS. 8A-8B and 9A-9B are mainly with regards to portions of the RF head. Therefore, the details of the baseband modules used in accordance with the aspects described further herein are not further described.

Furthermore, similar to the transmit chain architecture aspects discussed herein, the various receive chain aspects may be configured to operate in accordance with any one of the baseband modules as discussed herein. Thus, the baseband module in conjunction with the RF heads, which may include the radio head partitions 800, 900 as discussed in FIGS. 8A-8B and 9A-9B, respectively, may form part of a wireless radio configuration that improves upon the conventional designs as noted above. As an example, the RF heads shown and discussed further herein with reference to FIGS. 8A-8B and 9A-9B may be used in conjunction with any suitable type of baseband module(s). For example, a baseband module similar to the example baseband module 300 as shown and described above with reference to FIG. 3A, which uses a single coaxial cable to carry both V and H receive data streams, may be coupled to the other end of the coaxial cable shown in FIGS. 8B and 9B.

Like the RF heads 500, 700 discussed with reference to FIGS. 5A-5B and 7A-7B with respect to the transmit chains, the RF heads shown and discussed herein with reference to FIGS. 8A-8B and 9A-9B with respect to the receive chains also differ from the conventional RF head configuration in several ways, which are further discussed below. Similar to the transmit chains, one difference is with regards to the partitioning within the RF heads 800, 900. For example, the RF head 800 as shown in FIGS. 8A-8B may be generally grouped into two partitions 800A, as shown in FIG. 8A, and 800B, as shown in FIG. 8B. These two partitions 800A, 800B are split for clarity and ease of explanation regarding the details of their operation. However, aspects include the partitions 800A, 800B being implemented as part of a single RF head design, which may be incorporated on a single chip such as an RFIC, for example, or as any other suitable type of integrated circuit design.

Figure 9A:
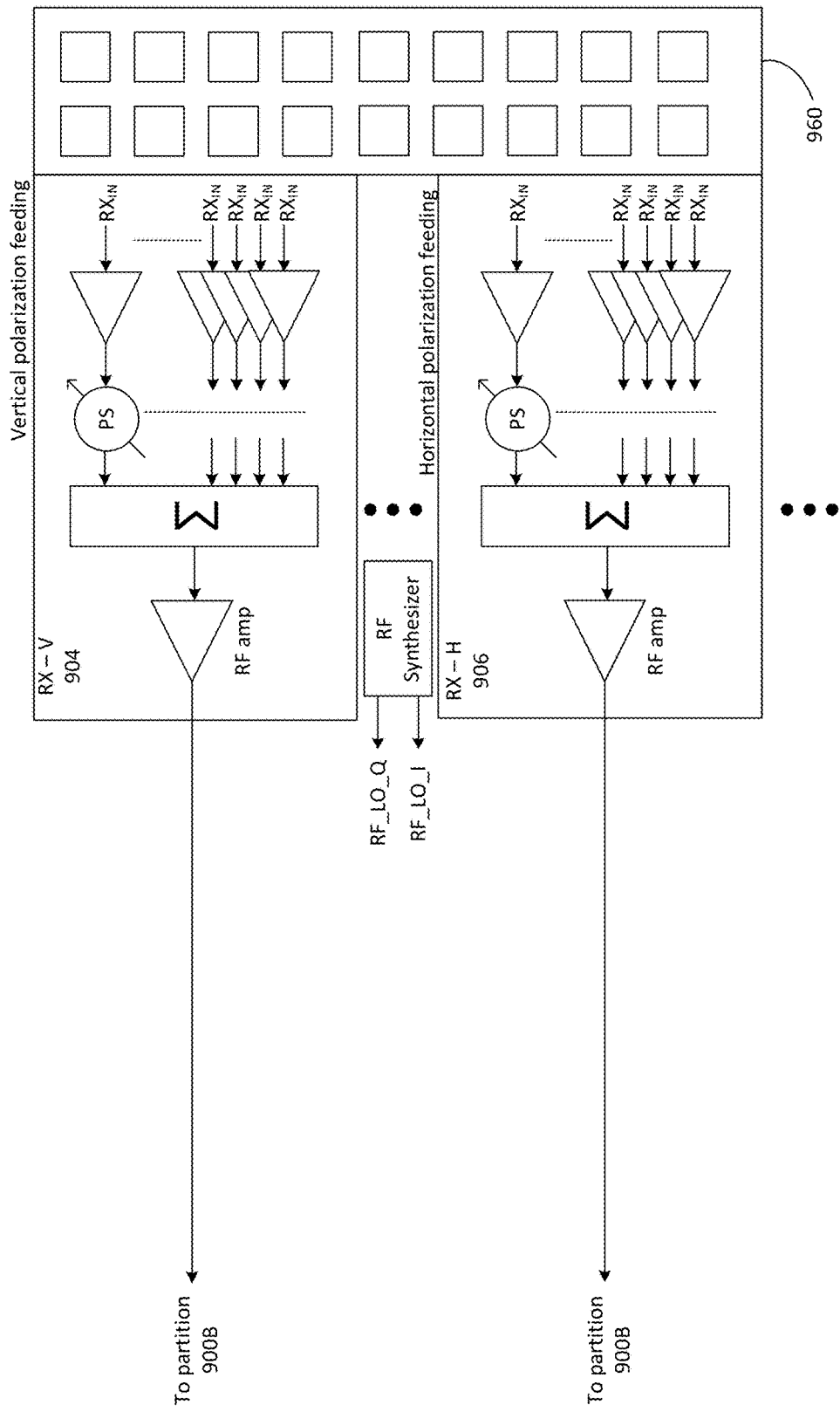
FIGS. 9A-9B illustrate an exemplary detailed block diagram of an IFoC phased array system with a single coaxial cable carrying V and H polarized receive data streams between the RF head and the baseband module using direct down-conversion to baseband, in accordance with an aspect of the disclosure.
Figure 9B:
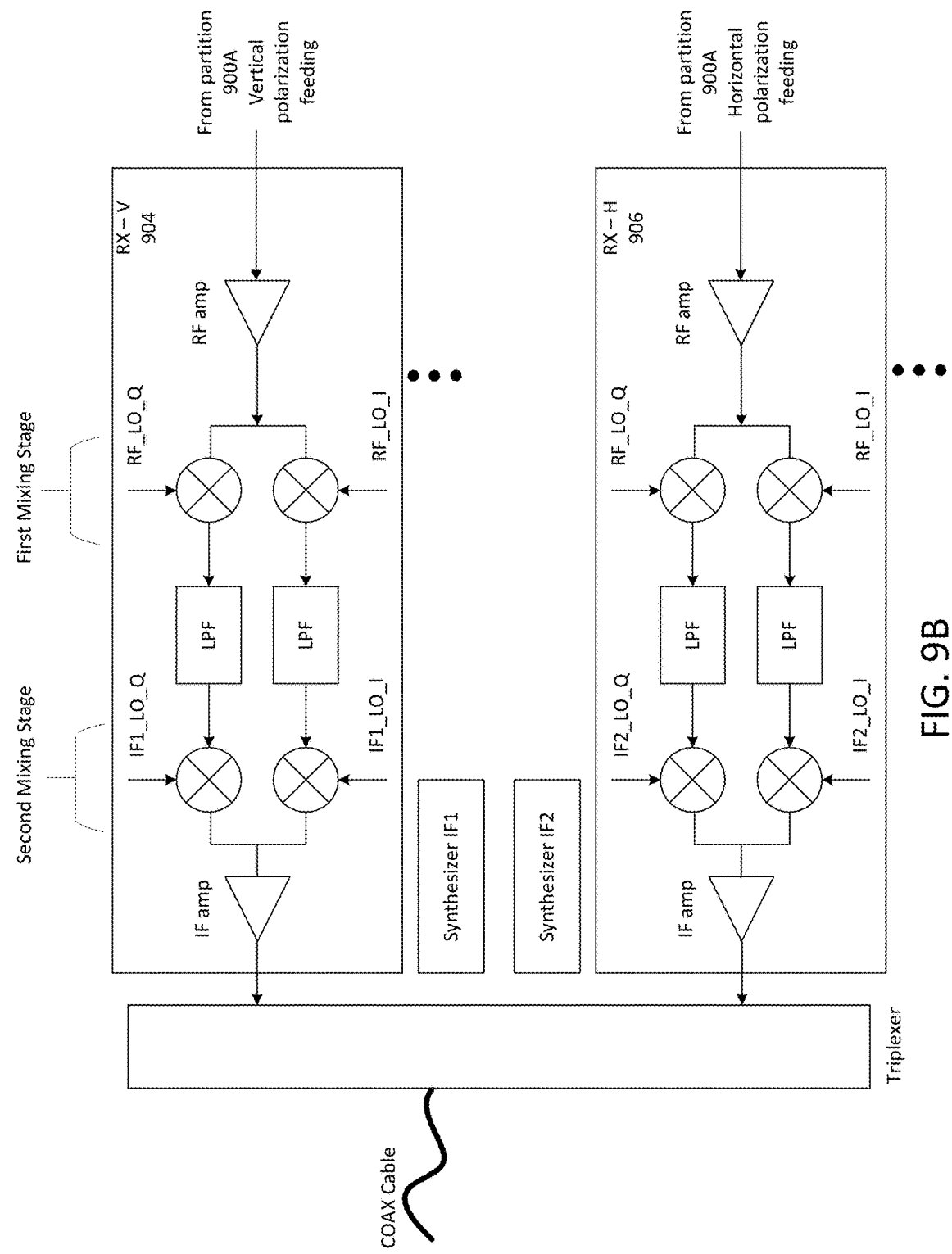

Moreover, the various receive chains and transmit chains, although described herein for ease of explanation as part of RF heads in different Figures, may be combined with one another on a common substrate, chip, die, etc. (e.g., an RFIC). For instance, the transmit chains 504, 506 as shown in FIGS. 5A-5B may form part of the same RF head configuration with the receive chains 804, 806 as shown in FIGS. 8A-8B. As an additional example, the transmit chains 704, 706 as shown in FIGS. 7A-7B may form part of the same RF head configuration with the receive chains 904, 906 as shown in FIGS. 9A-9B.

In this example of a receive chain configuration, the partition 800A may operate in a substantially similar manner as the receive chain 256 shown in FIG. 2B. For example, the receive chains 804, 806 shown in FIG. 8A may be identified with, operate, and be configured in a substantially similar or identical manner as the receive chain 256 shown in FIG. 2B. Therefore, only differences between the components of these different receive chains will be further described. In an aspect, the receive chains 804, 806 in partition 800A may be configured to receive data streams via the phased array 860, combine the data streams with the appropriate phase and amplitude weighting into a combined data stream via the combination block (denoted 2), and amplify the combined data stream via the RF amplifier.

The partition 800A is also configured to down-convert the received I/Q data streams from the RF (received) frequency to the IF frequency. As shown in FIG. 8A, this may be performed via the use of a first mixing stage that utilizes a LO signal at the appropriate RF frequency. In an aspect, although not shown in FIG. 8A for purposes of brevity, filtering may also be applied (e.g., in the RF domain) prior to combining the different data streams to avoid jamming by adjacent receive channels.

Tuning now to FIG. 8B, the partition 800B may receive the combined RX data streams (at the IF frequency), which may then be amplified in the IF domain and down-converted to baseband via a second mixing stage that implements an IF LO signal that is appropriately phase-shifted for each of the in-phase and quadrature component signals. The partition 800B may perform a low-pass filtering operation in the baseband domain, and then up-convert the filtered baseband RX data streams back to the IF frequency via a third mixing stage using the IF LO signals as shown. These filtered RX data streams at the IF frequency may then be combined via a triplexer or other suitable means (e.g., a combiner) and passed to the baseband modem via a coaxial cable. The baseband modem may down-convert the RX data streams to baseband, convert the analog data streams to digital signals, and perform the appropriate digital signal processing to extract data from the received data streams. Thus, the receive chain aspects include the second partition 800B of the RF head 800 performing baseband domain low-pass filtering via the LPF within each of the I and Q paths of each of the receive chains 804, 806, as shown in FIG. 8B. Similar to the transmit chain aspects, the receive chain aspects include the filtered I and Q data streams being coupled to the baseband module via the coaxial cable.

Analogous to the transmit chains discussed herein, conventional receive chain architectures also typically include high Q (>100) band-pass filters between the output of the IF amplifiers within each of the receive chains 804, 806 and the triplexer as shown in FIB. 8B. These traditional bandpass filtering techniques aim to filter out adjacent data channels received in each of the receive chains, although the high Q requirements often result in inadequate filtering of the unwanted adjacent channels. The aspects described herein address this issue by using low-pass filtering in the baseband domain, which advantageously reduces the filter Q specifications compared to the use of such external bandpass filters that are traditionally used for this purpose. Thus, aspects include implementing the LPFs as shown in FIG. 8B in place of the BPFs that are traditionally required for filtering at higher frequencies (i.e., higher than the baseband frequency, such as IF or RF). The advantages for doing so in the receive chain were discussed above with reference to the transmit chains, and include enabling the use of a less complex filter design.

Similar to the transmit chains 504, 506, aspects include the RF head 800 implementing the same reference frequency (e.g., the reference frequency provided by the reference frequency generator 307 as shown in FIG. 3A via the coaxial cable) for the IF synthesizers 805.1, 805.2 and the IF synthesizers 305.1, 305.2. Thus, each of the IF synthesizers 305.1, 305.2, 805.1, 805.2 produces a corresponding synthesized IF frequency having substantially the same error as one another. Thus, like the transmit chain aspects, no additional frequency error is introduced via the up-conversion of the IF signal at the partition 800B, and therefore the baseband I/Q data streams filtered via the LPFs may have substantially the same frequency error as those received and processed via the baseband module.

Aspects include the IF synthesizers and/or LPFs as shown and described with reference to FIGS. 8A-8B being dynamically tunable and/or adjustable based upon measured impairment data or other suitable information, as discussed herein with reference to the transmit chains. For instance, the IF synthesizers 305.1, 305.2, 805.1, and/or 805.2 may vary the IF frequency, which in turn shifts the IF frequency used by the baseband module and the partition 800B for the up-conversion and down-conversion of the I/Q data streams. In this way, the aspects described herein enable the use of an adjustable IF frequency to prevent the receipt of known blocker signals, such as LTE and Wi-Fi harmonics, for example.

Furthermore, because the LPFs implemented by the partition 800B have a less complex design than bandpass filters and work in the baseband domain, aspects also include the LPFs having respective tuning parameters that may be dynamically tuned based upon known desired results to be achieved (e.g., to filter known spurs). Additionally or alternatively, the measured impairment data as discussed herein with respect to the transmit chains, for example, may identify such blocker signals, sources of interference, etc., and this information may be utilized to appropriately adjust the IF frequency and/or the LPF filter parameters. Additionally or alternatively, aspects include the filter parameters associated with the image and LO rejection blocks as shown in FIG. 8A being dynamically adjusted in response to the measured impairment data, or using other data or information regarding the operating environment. The dynamic adjustment of the IF frequency, the image and LO rejection block parameters, and/or the LPF parameters may be performed, for instance, by the baseband module 300 or another suitable computer processor (e.g., as discussed herein with reference to FIG. 8).

Again, the aspects described herein with reference FIGS. 8A-8B utilize two down-conversion stages. In particular, the first of these is performed via the first partition 800A (e.g., the first mixing stage to IF), as shown in FIG. 8A. A second down-conversion (to baseband) is then performed within the second RF head partition 800B (in the second mixing stage) prior to performing low-pass filtering in the baseband domain. This dual down-conversion technique is advantageous, as noted above, because the IF frequency synthesizers may utilize the same reference frequency and, as a result, low power, low quality, and low cost IF synthesizers can be implemented. But, as was the case for the transmit chains, doing so requires the use of additional die area due to these additional mixing stages. Thus, in other aspects as shown and discussed below with reference to FIGS. 9A-9B, the first mixing stage in the first partition 800A and the second mixing stage in the second partition 800B may be replaced with a single mixing stage that provides a direct down-conversion to baseband from the RF receiving frequency.

For example, as shown in FIG. 9A-9B, aspects include the RF head 900 implementing two partitions 900A and 900B, which are similar to the partitions 800A and 800B as discussed herein with reference to FIGS. 8A-8B, and thus only differences between the RF head 800 and the RF head 900 will be further described. For example, the RF head 900 may also be coupled to a baseband module via a coaxial cable (e.g., baseband module 300 as shown in FIG. 3A), which carries a combined I/Q data stream at the IF frequency from the vertical and horizontal receive chains 904, 906 to the baseband module. In the example aspect shown in FIG. 9B, however, the partition 900B includes a direct-to-baseband down-conversion mixing stage (e.g., the first mixing stage) as opposed to the first and second mixing stages performed by the partitions 800A, 800B as shown in FIGS. 8A-8B.

To do so, the second partition 900B utilizes RF LO frequencies for the mixer inputs at the I and Q branches in the first mixing stage. Furthermore, the second partition 900B implements RF amplifiers instead of IF amplifiers at its input (i.e., the input to the first mixing stage in each of the I and Q branches). And, similar to the RF head 800 and the transmit chain aspects discussed herein, aspects include the baseband module 300 utilizing the measured impairment data (or other suitable information) to appropriately compensate for impairments in the modem 302 via the I/Q mismatch and LO leakage correction, as well as dynamically adjusting the IF frequency signals used for IF up- and down-conversion and/or the LPF filter parameters.

Again, the RF head 900 directly down-converts the received RF signal to baseband for low-pass filtering. In this example, both the vertical and the horizontal polarization chains 904, 906 use the same RF synthesizer, as shown in FIG. 9A. Of course, because each I and Q data stream mixer utilizes a separate LO signal (i.e., RF_LO_I and RF_LO_Q) as shown in FIG. 9B, the RF synthesizer generates separate RF LO signals having the appropriate phase shift for I/Q modulation, as shown in FIG. 9A. By utilizing the same RF synthesizer in this manner, the number of RF synthesizers used in the RF head 900 are reduced by half compared to those used by the RF head 800. For instance, the RF head 800 uses two separate RF synthesizers RF1 and RF2 in the first partition 800A to generate two distinct RF LO signals RF1_LO and RF2_LO. Another added advantage of the use of a single RF synthesizer is the elimination of the image and LO rejection filter as shown in FIG. 9A. Such image and LO rejection filters take up additional die area, and thus their elimination may further save die area.

The aspects described herein are not limited to the examples shown in the Figures. In particular, the number of data streams carried over the coaxial cable between the baseband module and the RF head may be further increased from the examples described herein. For example, the coaxial cable shown in FIGS. 5A, 7A, 8B, and 9B may carry two data streams—one associated with each polarization of a single transit or receive frequency. However, aspects include the coaxial cable carrying any suitable number of data streams, and the RF heads also including any suitable number of transmit and/or receive chains to accommodate these data streams. To provide an illustrative example, the baseband module shown in FIG. 300 may implement a modem 302 that is configured to generate two or more different frequencies, each having its own respective polarization. Continuing this example, the baseband module 300 may include additional IF transmit chains (e.g., two, if two frequencies are used), and the RF heads 500, 700, 800, 900 may likewise be expanded to include additional transmit and/or receive chains—one for each data stream having its own unique frequency and polarization.

As another illustrative example, the aspects described herein may be applied to any suitable number of unique data streams, which may or may not include the use of separate polarizations. For instance, the aspects described herein may be implemented for mmWave systems that use carrier aggregation (CA) to concurrently operate a number of bands at different frequencies. One such example is interband CA with frequency bands at 29 GHz and 39 GHz. As an illustrative example, the aspects described herein may function with four transmit chains and four receive chains to allow concurrent operation at each of these frequencies, thereby facilitating CA. In this example, the single coaxial cable as discussed with reference to FIGS. 3, 5A, 7A, 8B, and 9B may carry four data streams at one time (e.g., 4 TX data streams and 4 RX data streams, 2 TX data streams and 2 RX data streams, etc.), one for each CA frequency and polarization.

Figure 10:
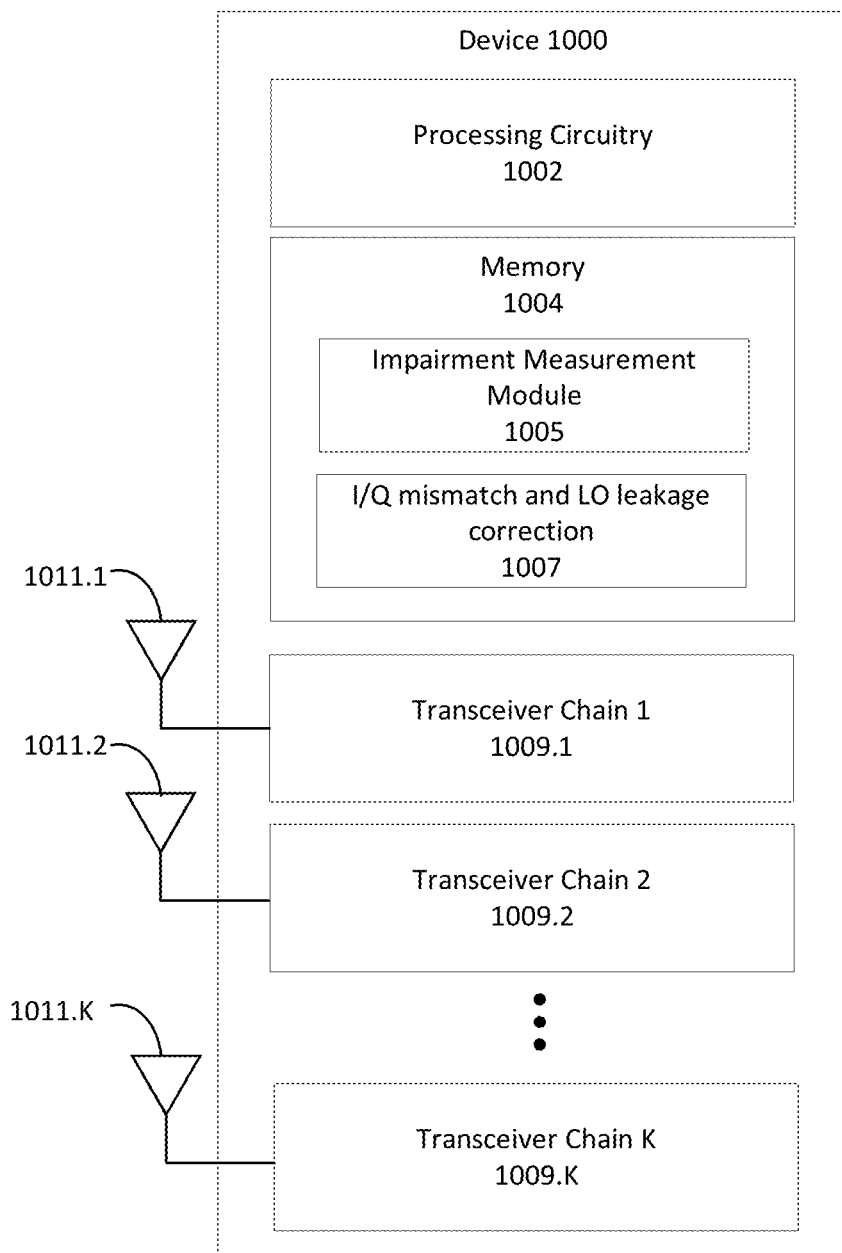
FIG. 10 illustrates a block diagram of an exemplary wireless device, in accordance with an aspect of the disclosure.

FIG. 10 illustrates a block diagram of an exemplary wireless device, in accordance with an aspect of the disclosure. In an aspect, the device 1000 may include processing circuitry 1002, a memory 1004, and any suitable number K of transceiver chains 1009.1-1009.K, each being coupled to one or more respective antennas 1011.1-1111.N. The components shown in FIG. 10 are provided for ease of explanation, and aspects include device 1000 including additional, less, or alternative components as those shown in FIG. 10. For example, device 1000 may include one or more power sources, display interfaces, peripheral devices, ports, etc. To provide additional examples, the device 1000 may further include one or more receiver chains or transmit chains in place of one or more of the transceiver chains 1009.1-1009.K.

In an aspect, the various components of device 1000 may be identified with functionality further described herein with reference to the transmission and reception of wireless signals in an IFoC system. For example, the device 1000 may be configured to receive and/or transmit signals via one or more of transceiver chains 1009.1-1009.K, which are wirelessly received and/or transmitted via the coupled antennas 1011.1-1011.K at any suitable frequency or band of frequencies, and/or in accordance with any suitable number and type of communication protocols. In an aspect, each of the transceiver chains 1009.1-1009.K may be identified with one or more transmit chains and receive chains as described herein with reference to the various implementations of the IFoC transmitter and receiver partitioning. For example, one or more of the transceiver chains 1009.1-1009.3K may include a transmit chain that may be identified with one or more of the transmit chains 504, 506, 704, 706, as discussed herein with reference to FIGS. 5A-5B and 7A-7B. Additionally or alternatively, one or more of the transceiver chains 1009.1-1009.3K may, for example, include a receive chain that may be identified with one or more of the receive chains 804, 806, 904, 906, as discussed herein with reference to FIGS. 8A-8B and 9A-9B.

To do so, processing circuitry 1002 may be configured as any suitable number and/or type of computer processors, which may facilitate control of the device 1000 as discussed herein. Processing circuitry 1002 may be identified with one or more processors (or suitable portions thereof) implemented by the device 1000. As discussed herein, processing circuitry 1002 may, for example, be identified with one or more processors implemented by the device 1000 such as a host processor of the device 1000, a digital signal processor, one or more microprocessors, microcontrollers, an application-specific integrated circuit (ASIC), etc. In any event, aspects include the processing circuitry 1002 being configured to carry out instructions to perform arithmetical, logical, and/or input/output (I/O) operations, and/or to control the operation of one or more components of the device 1000.

For example, the processing circuitry 1002 can include one or more microprocessor cores, memory registers, buffers, clocks, etc., and may support baseband processing operations in conjunction with a baseband processor that may form part of (or the entirety of) the processing circuitry 1002 or may be implemented as a separate processor not shown in FIG. 10. The processing circuitry 1002 may additionally be configured to perform typical wireless data communication functions, such as MIMO signal weighting, phase-shifting, signal stream combining, etc. Moreover, aspects include processing circuitry 1002 communicating with and/or controlling functions associated with the memory 1004 and/or other components of the transceiver chains 1009.1-1009.K. This may include, for example, monitoring the impairments associated with the I and Q data branches of one or more transmitters and/or receivers, as well as computing the appropriate signal compensation n the baseband module.

In an aspect, the memory 1004 stores data and/or instructions such that, when the instructions are executed by the processing circuitry 1002, the processing circuitry 1002 performs various functions described herein. The memory 1004 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1004 can be non-removable, removable, or a combination of both.

For example, the memory 1004 may be implemented as a non-transitory computer readable medium storing one or more executable instructions such as, for example, logic, algorithms, code, etc. As further discussed below, the instructions, logic, code, etc., stored in the memory 1004 are represented by the various modules as shown in FIG. 10, which may enable the aspects disclosed herein to be functionally realized. Alternatively, if the aspects described herein are implemented via hardware, the modules shown in FIG. 10 associated with the memory 1004 may include instructions and/or code to facilitate control and/or monitor the operation of such hardware components. In other words, the modules shown in FIG. 10 are provided for ease of explanation regarding the functional association between hardware and software components. Thus, aspects include the processing circuitry 1002 executing the instructions stored in these respective modules in conjunction with one or more hardware components to perform the various functions associated with the aspects as further discussed herein.

In an aspect, the executable instructions stored in impairment measurement module 1005 may facilitate, in conjunction with the processing circuitry 1002, the identification of impairments such as I/Q imbalance and/or LO leakage. This may include, for instance, the control and/or measurement of impairment data from one or more suitable components that are part of a feedback path. For instance, this may include the measurement of data obtained via an envelope detector within the path of a transmit chain, as discussed herein with reference to FIGS. 5A and 7A. As another example, this may include the measurement of data obtained via any suitable techniques for use within a receive chain, which may be used for image and LO rejection filtering, as discussed herein with reference to FIGS. 5B and 8A.

In an aspect, the executable instructions stored in the I/Q mismatch and LO leakage correction module 1007 may facilitate, in conjunction with the processing circuitry 1002, the calculation of the appropriate signals, coefficients, etc., to at least partially compensate for the measured impairments as noted above. For example, this may include the generation of pre-distortion signals used by the baseband modem, the calculation of various filter coefficients (e.g., those associated with the image and LO rejection filters and/or the LPF filters), the dynamic adjustment of the reference frequency used by the IF synthesizers, the frequency of the synthesized IF LO frequency signal, the reference frequency used by the RF synthesizers and/or the frequency of generated RF LO frequency signal, etc., as shown and described with reference to FIGS. 5A-5B, 7A-7B, 8A-8B, and 9A-9B. Such signal compensation, dynamic frequency adjustment, and/or the dynamic tuning adjustment of filter parameters may be performed, for instance, in accordance with any suitable type of known signal processing and/or error correction techniques.

EXAMPLES

The following examples pertain to further aspects.

Example 1 is a transmitter, comprising: a first transmitter portion configured to down-convert in-phase and quadrature-phase (I/Q) data signals from an intermediate frequency (IF) to a baseband frequency, and to filter the I/Q data signals in the baseband domain to provide filtered baseband I/Q data signals; and a second transmitter portion configured to transmit a radio frequency (RF) signal via a phased array system based upon the filtered baseband I/Q data signals, wherein the first transmitter portion and the second transmitter portion are integrated as part of a common radio frequency integrated circuit (RFIC).

In Example 2, the subject matter of Example 1, further comprising: a baseband portion configured to generate the I/Q data signals at the IF frequency, wherein the baseband portion and the first transmitter portion are coupled to one another via a coaxial cable over which the I/Q data signals are sent at the IF frequency.

In Example 3, the subject matter of one or more of Examples 1-2, further comprising: a baseband portion configured to generate the I/Q data signals using a first IF frequency signal that is generated using an IF reference signal, and wherein the first transmitter portion is configured to down-convert the I/Q data signals from the IF to the baseband frequency using a second IF frequency signal that is generated using the IF reference signal.

In Example 4, the subject matter of one or more of Examples 1-3, wherein the I/Q data signals constitute one data stream from among a plurality of data streams generated at the IF frequency that are carried over the coaxial cable, and wherein the first transmitter portion and the second transmitter portion include a plurality of transmit chains, each transmit chain from among the plurality of transmit chains being configured to: down-convert each respective one of the plurality of data streams from the IF frequency to the baseband frequency, filter each respective one of the plurality of data streams in the baseband domain to provide a plurality of respective filtered baseband data streams, and transmit a plurality of RF signals via the phased array system based upon the plurality of respective filtered baseband data streams.

In Example 5, the subject matter of one or more of Examples 1-4, wherein the first transmitter portion includes a first mixing stage configured to down-convert the I/Q data signals from the IF frequency to the baseband frequency, and a second mixing stage configured to up-convert the filtered baseband I/Q data signals from the baseband frequency to the IF frequency to generate filtered IF I/Q data signals, and wherein the second transmitter portion is configured to transmit the RF signal via the phased array system based upon the filtered IF I/Q data signals.

In Example 6, the subject matter of one or more of Examples 1-5, further comprising: a baseband portion configured to generate the I/Q data signals at the IF frequency using a first IF frequency signal that is generated using an IF reference signal, and wherein the first transmitter portion is configured to down-convert the I/Q data signals from the IF frequency to the baseband frequency in the first mixing stage using a second IF frequency signal that is generated using the IF reference signal, and to up-convert the filtered baseband I/Q data signals from the baseband frequency to the IF frequency in the second mixing stage using the second IF frequency signal.

In Example 7, the subject matter of one or more of Examples 1-6, wherein the first transmitter portion includes a first mixing stage configured to down-convert the I/Q data signals from the IF frequency to the baseband frequency, and a second mixing stage configured to up-convert the filtered baseband I/Q data signals from the baseband frequency directly to an RF transmit frequency to generate filtered RF I/Q data signals, and wherein the second transmitter portion is configured to transmit the RF signal via the phased array system based upon the filtered RF I/Q data signals.

In Example 8, the subject matter of one or more of Examples 1-7, wherein the I/Q data signals constitute one data stream from among two data streams, and wherein the first transmitter portion and the second transmitter portion include two transmit chains, with each transmit chain from among the two transmit chains being configured to: down-convert a respective one of the two data streams from the IF frequency to the baseband frequency, filter each respective one of the two data streams in the baseband domain to provide two respective filtered baseband data streams, up-convert each respective one of the two filtered baseband I/Q data streams from the baseband frequency directly to an RF transmit frequency to generate two respective filtered RF I/Q data streams, and transmit two RF signals via the phased array system based upon each respective one of the two respective filtered baseband data streams.

In Example 9, the subject matter of one or more of Examples 1-8, wherein each of the two transmit chains associated with the first transmitter portion is configured to up-convert the filtered baseband I/Q data signals directly to the RF transmit frequency using an RF local oscillator (LO) signal that is generated by a common RF synthesizer.

Example 10 is a wireless radio, comprising: a baseband portion configured to up-convert each one of a set of in-phase and quadrature-phase (I/Q) data signals from a baseband frequency to an intermediate frequency (IF); and a set of transmit chains, each transmit chain from among the set of transmit chains configured, for each respective one of the I/Q data signals, to: down-convert the in-phase and quadrature-phase (I/Q) data signals to the baseband frequency, filter the I/Q data signals in the baseband domain to provide filtered baseband I/Q data signals, up-convert the filtered baseband I/Q data signals to a frequency that is higher than the baseband frequency, and transmit a radio frequency (RF) signal via a phased array system based upon the filtered baseband I/Q data signals, wherein the baseband portion and the set of transmit chains are coupled to one another via a coaxial cable over which the set of I/Q data signals are sent.

In Example 11, the subject matter of Example 10, wherein the set of transmit chains are integrated as part of a common radio frequency integrated circuit (RFIC).

In Example 12, the subject matter of one or more of Examples 10-11, wherein the frequency that is higher than the baseband frequency to which the filtered baseband I/Q data signals are up-converted is the IF frequency.

In Example 13, the subject matter of one or more of Examples 10-12, wherein the frequency that is higher than the baseband frequency to which the filtered baseband I/Q data signals are up-converted is a radio frequency (RF) transmit frequency at which the RF signal is transmitted via the phased array system.

In Example 14, the subject matter of one or more of Examples 10-13, wherein the baseband portion is configured to up-convert each one of the set of I/Q data signals from the baseband frequency to the IF frequency using a first IF frequency signal that is generated using an IF reference signal, and wherein each transmit chain from among the set of transmit chains is configured to up-convert each respective one of the filtered baseband I/Q data signals to the IF frequency using a second IF frequency signal that is generated using the IF reference signal.

In Example 15, the subject matter of one or more of Examples 10-14, wherein each transmit chain from among the set of transmit chains is configured to up-convert each respective one of the filtered baseband I/Q data signals to the RF transmit frequency using an RF local oscillator (LO) signal that is generated by a common RF synthesizer.

Example 16 is a wireless device, comprising: processing circuitry configured to up-convert each one of a set of in-phase and quadrature-phase (I/Q) data signals from a baseband frequency to an intermediate frequency (IF); and a transceiver chain configured to, for each respective one of the I/Q data signals, (i) down-convert the I/Q data signals from the intermediate frequency (IF) to a baseband frequency, (ii) filter the I/Q data signals in the baseband domain to provide filtered baseband I/Q data signals, and (iii) transmit a radio frequency (RF) signal via a phased array system based upon the filtered baseband I/Q data signals, wherein the processing circuitry and the transceiver chain are coupled to one another via a coaxial cable over which the set of I/Q data signals are sent.

In Example 17, the subject matter of Example 16, wherein the processing circuitry is configured to generate the set of I/Q data signals using a first IF frequency signal that is generated using an IF reference signal, and wherein the transceiver chain is configured to down-convert each respective one of the set of I/Q data signals from the intermediate frequency (IF) to the baseband frequency using a second IF frequency signal that is generated using the IF reference signal.

In Example 18, the subject matter of one or more of Examples 16-17, wherein the transceiver chain comprises: a first mixing stage configured to down-convert each respective one of the set of I/Q data signals from the IF frequency to the baseband frequency; and a second mixing stage configured to up-convert each respective one of the filtered baseband I/Q data signals from the baseband frequency to the IF frequency to generate a set of filtered IF I/Q data signals, and wherein the transceiver chain is configured to transmit the RF signal via the phased array system based upon the set of filtered IF I/Q data signals.

In Example 19, the subject matter of one or more of Examples 16-18, wherein the processing circuitry is configured to generate the set of I/Q data signals using a first IF frequency signal that is generated using an IF reference signal, and wherein the transceiver chain is configured to down-convert each respective one of the I/Q data signals to the baseband frequency in the first mixing stage using a second IF frequency signal that is generated using the IF reference signal, and to up-convert each respective one of the filtered baseband I/Q data signals from the baseband frequency to the IF frequency in the second mixing stage using the second IF frequency signal.

In Example 20, the subject matter of one or more of Examples 16-19, wherein the transceiver chain comprises: a first mixing stage configured to down-convert each respective one of the I/Q data signals from the IF to the baseband frequency; and a second mixing stage configured to up-convert each respective one of the filtered baseband I/Q data signals from the baseband frequency directly to an RF transmit frequency to generate filtered RF I/Q data signals, wherein the transceiver chain is configured to transmit the RF signal via the phased array system based upon the set of filtered RF I/Q data signals.

Example 21 is a transmitter means, comprising: a first transmitter portion means for down-converting in-phase and quadrature-phase (I/Q) data signals from an intermediate frequency (IF) to a baseband frequency, and for filtering the I/Q data signals in the baseband domain to provide filtered baseband I/Q data signals; and a second transmitter portion means for transmitting a radio frequency (RF) signal via a phased array system based upon the filtered baseband I/Q data signals, wherein the first transmitter portion means and the second transmitter portion means are integrated as part of a common radio frequency integrated circuit (RFIC).

In Example 22, the subject matter of Example 21, further comprising: a baseband portion means for generating the I/Q data signals at the IF frequency, wherein the baseband portion means and the first transmitter portion means are coupled to one another via a coaxial cable over which the I/Q data signals are sent at the IF frequency.

In Example 23, the subject matter of one or more of Examples 21-22, further comprising: a baseband portion means for generating the I/Q data signals using a first IF frequency signal that is generated using an IF reference signal, and wherein the first transmitter portion means down-converts the I/Q data signals from the IF to the baseband frequency using a second IF frequency signal that is generated using the IF reference signal.

In Example 24, the subject matter of one or more of Examples 21-23, wherein the I/Q data signals constitute one data stream from among a plurality of data streams generated at the IF frequency that are carried over the coaxial cable, and wherein the first transmitter portion means and the second transmitter portion means include a plurality of transmit chains, each transmit chain from among the plurality of transmit chains being configured to: down-convert each respective one of the plurality of data streams from the IF frequency to the baseband frequency, filter each respective one of the plurality of data streams in the baseband domain to provide a plurality of respective filtered baseband data streams, and transmit a plurality of RF signals via the phased array system based upon the plurality of respective filtered baseband data streams.

In Example 25, the subject matter of one or more of Examples 21-24, wherein the first transmitter portion means includes a first mixing means for down-converting the I/Q data signals from the IF frequency to the baseband frequency, and a second mixing means for up-converting the filtered baseband I/Q data signals from the baseband frequency to the IF frequency to generate filtered IF I/Q data signals, and wherein the second transmitter portion means transmits the RF signal via the phased array system based upon the filtered IF I/Q data signals.

In Example 26, the subject matter of one or more of Examples 21-25, further comprising: a baseband portion means for generating the I/Q data signals at the IF frequency using a first IF frequency signal that is generated using an IF reference signal, and wherein the first transmitter portion means down-converts the I/Q data signals from the IF frequency to the baseband frequency in the first mixing means using a second IF frequency signal that is generated using the IF reference signal, and up-converts the filtered baseband I/Q data signals from the baseband frequency to the IF frequency in the second mixing means using the second IF frequency signal.

In Example 27, the subject matter of one or more of Examples 21-26, wherein the first transmitter portion means includes a first mixing means for down-converting the I/Q data signals from the IF frequency to the baseband frequency, and a second mixing means for up-converting the filtered baseband I/Q data signals from the baseband frequency directly to an RF transmit frequency to generate filtered RF I/Q data signals, and wherein the second transmitter portion means transmits the RF signal via the phased array system based upon the filtered RF I/Q data signals.

In Example 28, the subject matter of one or more of Examples 21-27, wherein the I/Q data signals constitute one data stream from among two data streams, and wherein the first transmitter portion means and the second transmitter portion means include two transmit chains, with each transmit chain from among the two transmit chains being configured to: down-convert a respective one of the two data streams from the IF frequency to the baseband frequency, filter each respective one of the two data streams in the baseband domain to provide two respective filtered baseband data streams, up-convert each respective one of the two filtered baseband I/Q data streams from the baseband frequency directly to an RF transmit frequency to generate two respective filtered RF I/Q data streams, and transmit two RF signals via the phased array system based upon each respective one of the two respective filtered baseband data streams.

In Example 29, the subject matter of one or more of Examples 21-28, wherein each of the two transmit chains associated with the first transmitter portion means is configured to up-convert the filtered baseband I/Q data signals directly to the RF transmit frequency using an RF local oscillator (LO) signal that is generated by a common RF synthesizer.

Example 30 is a wireless radio, comprising: a baseband portion means for up-converting each one of a set of in-phase and quadrature-phase (I/Q data signals from a baseband frequency to an intermediate frequency (IF); and a set of transmit means, each transmit means from among the set of transmit means, for each respective one of the I/Q data signals, down-converting the in-phase and quadrature-phase (I/Q data signals to the baseband frequency, filtering the I/Q data signals in the baseband domain to provide filtered baseband I/Q data signals, up-converting the filtered baseband I/Q data signals to a frequency that is higher than the baseband frequency, and transmitting a radio frequency (RF) signal via a phased array system based upon the filtered baseband I/Q data signals, wherein the baseband portion means and the set of transmit means are coupled to one another via a coaxial cable over which the set of I/Q data signals are sent.

In Example 31, the subject matter of Example 30, wherein the set of transmit means are integrated as part of a common radio frequency integrated circuit (RFIC).

In Example 32, the subject matter of one or more of Examples 30-31, wherein the frequency that is higher than the baseband frequency to which the filtered baseband I/Q data signals are up-converted is the IF frequency.

In Example 33, the subject matter of one or more of Examples 30-32, wherein the frequency that is higher than the baseband frequency to which the filtered baseband I/Q data signals are up-converted is a radio frequency (RF) transmit frequency at which the RF signal is transmitted via the phased array system.

In Example 34, the subject matter of one or more of Examples 30-33, wherein the baseband portion means up-converts each one of the set of I/Q data signals from the baseband frequency to the IF frequency using a first IF frequency signal that is generated using an IF reference signal, and wherein each transmit means from among the set of transmit means up-converts each respective one of the filtered baseband I/Q data signals to the IF frequency using a second IF frequency signal that is generated using the IF reference signal.

In Example 35, the subject matter of one or more of Examples 30-34, wherein each transmit means from among the set of transmit means up-converts each respective one of the filtered baseband I/Q data signals to the RF transmit frequency using an RF local oscillator (LO) signal that is generated by a common RF synthesizer.

Example 36 is a wireless device means, comprising: processing means for up-converting each one of a set of in-phase and quadrature-phase (I/Q) data signals from a baseband frequency to an intermediate frequency (IF); and a transceiver means for, each respective one of the I/Q data signals, (i) down-converting the I/Q data signals from the intermediate frequency (IF) to a baseband frequency, (ii) filtering the I/Q data signals in the baseband domain to provide filtered baseband I/Q data signals, and (iii) transmitting a radio frequency (RF) signal via a phased array system based upon the filtered baseband I/Q data signals, wherein the processing means and the transceiver means are coupled to one another via a coaxial cable over which the set of I/Q data signals are sent.

In Example 37, the subject matter of Example 36, wherein the processing means generates the set of I/Q data signals using a first IF frequency signal that is generated using an IF reference signal, and wherein the transceiver means down-converts each respective one of the set of I/Q data signals from the intermediate frequency (IF) to the baseband frequency using a second IF frequency signal that is generated using the IF reference signal.

In Example 38, the subject matter of one or more of Examples 36-37, wherein the transceiver means comprises: a first mixing means for down-converting each respective one of the set of I/Q data signals from the IF frequency to the baseband frequency; and a second mixing means for up-converting each respective one of the filtered baseband I/Q data signals from the baseband frequency to the IF frequency to generate a set of filtered IF I/Q data signals, and wherein the transceiver means transmits the RF signal via the phased array system based upon the set of filtered IF I/Q data signals.

In Example 39, the subject matter of one or more of Examples 36-38, wherein the processing means generates the set of I/Q data signals using a first IF frequency signal that is generated using an IF reference signal, and wherein the transceiver means down-converts each respective one of the I/Q data signals to the baseband frequency in the first mixing means using a second IF frequency signal that is generated using the IF reference signal, and up-converts each respective one of the filtered baseband I/Q data signals from the baseband frequency to the IF frequency in the second mixing means using the second IF frequency signal.

In Example 40, the subject matter of one or more of Examples 36-39, wherein the transceiver means comprises: a first mixing means for down-converting each respective one of the I/Q data signals from the IF to the baseband frequency; and a second mixing means for up-converting each respective one of the filtered baseband I/Q data signals from the baseband frequency directly to an RF transmit frequency to generate filtered RF I/Q data signals, wherein the transceiver means transmits the RF signal via the phased array system based upon the set of filtered RF I/Q data signals.

An apparatus as shown and described.

A method as shown and described.

CONCLUSION

Although the aspects have been described herein with reference to the use of a coaxial cable to connect the baseband modules and the RF heads (e.g., as shown in FIGS. 3B, 5A, 7A, 8B, 9B, etc.), the aspects described herein are not limited to these examples. The aspects described herein may be extended to the use of any suitable type of connection between the baseband modules and the RF heads. For example, the coaxial cables as shown and described herein may be replaced with one or more printed traces on a printed circuit board (PCB), flexible cable, etc. As another example, the coaxial cables as described herein may be used in combination with other suitable types of data signal connections (e.g., PCB traces) in parallel or in series with one another to provide a hybrid solution. For instance, a signal coupling between a baseband module and a RF head (TX, RX, or both) may include a first portion of a coaxial cable length that is coupled to a second portion of PCB traces.

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A transmitter, comprising:
   a first transmitter portion including:
   a first mixing stage configured to down-convert in-phase and quadrature-phase (I/Q) data signals, which are to be transmitted, from an intermediate frequency (IF) to a baseband frequency;
   a filter configured to filter the I/Q data signals in the baseband domain to provide filtered baseband I/Q data signals; and
   one or more additional mixing stages configured to up-convert the filtered baseband I/Q data signals from the baseband frequency to a frequency that is higher than the baseband frequency to generate up-converted I/Q data signals; and
   a second transmitter portion configured to transmit a radio frequency (RF) signal via a phased array system based upon the up-converted I/Q data signals,
   wherein the first transmitter portion and the second transmitter portion are integrated as part of a common radio frequency integrated circuit (RFIC).

2. The transmitter of claim 1, further comprising:
   a baseband portion configured to generate the I/Q data signals at the IF frequency,
   wherein the baseband portion and the first transmitter portion are coupled to one another via a coaxial cable over which the I/Q data signals are sent at the IF frequency.

3. The transmitter of claim 1, further comprising:
   a baseband portion configured to generate the I/Q data signals using a first IF frequency signal that is generated using an IF reference signal, and
   wherein the first transmitter portion is configured to down-convert the I/Q data signals from the IF to the baseband frequency using a second IF frequency signal that is generated using the IF reference signal.

4. The transmitter of claim 2, wherein the I/Q data signals constitute one data stream from among a plurality of data streams generated at the IF frequency that are carried over the coaxial cable, and
   wherein the first transmitter portion and the second transmitter portion include a plurality of transmit chains, each transmit chain from among the plurality of transmit chains being configured to:
   down-convert each respective one of the plurality of data streams from the IF frequency to the baseband frequency,
   filter each respective one of the plurality of data streams in the baseband domain to provide a plurality of respective filtered baseband data streams, and
   transmit a plurality of RF signals via the phased array system based upon the plurality of respective filtered baseband data streams.

5. The transmitter of claim 1, wherein the one or more additional mixing stages include a second mixing stage configured to up-convert the filtered baseband I/Q data signals from the baseband frequency to the IF frequency to generate, as the up-converted I/Q data signals, filtered IF I/Q data signals.

6. The transmitter of claim 5, further comprising:
   a baseband portion configured to generate the I/Q data signals at the IF frequency using a first IF frequency signal that is generated using an IF reference signal, and
   wherein the first transmitter portion is configured to down-convert the I/Q data signals from the IF frequency to the baseband frequency in the first mixing stage using a second IF frequency signal that is generated using the IF reference signal, and to up-convert the filtered baseband I/Q data signals from the baseband frequency to the IF frequency in the second mixing stage using the second IF frequency signal.

7. The transmitter of claim 1, wherein the one or more additional mixing stages include a second mixing stage configured to up-convert the filtered baseband I/Q data signals from the baseband frequency directly to an RF transmit frequency to generate, as the up-converted I/Q data signals, filtered RF I/Q data signals.

8. The transmitter of claim 1, wherein the I/Q data signals constitute one data stream from among two data streams, and
wherein the first transmitter portion and the second transmitter portion include two transmit chains, with each transmit chain from among the two transmit chains being configured to:
down-convert a respective one of the two data streams from the IF frequency to the baseband frequency,
filter each respective one of the two data streams in the baseband domain to provide two respective filtered baseband data streams,
up-convert each respective one of the two filtered baseband I/Q data streams from the baseband frequency directly to an RF transmit frequency to generate two respective filtered RF I/Q data streams, and
transmit two RF signals via the phased array system based upon each respective one of the two respective filtered baseband data streams.

9. The transmitter of claim 8, wherein each of the two transmit chains associated with the first transmitter portion is configured to up-convert the filtered baseband I/Q data signals directly to the RF transmit frequency using an RF local oscillator (LO) signal that is generated by a common RF synthesizer.

10. A wireless radio, comprising:
a baseband portion configured to up-convert each one of a set of in-phase and quadrature-phase (I/Q) data signals from a baseband frequency to an intermediate frequency (IF); and
a set of transmit chains, each transmit chain from among the set of transmit chains configured, for each respective one of the I/Q data signals, to:
down-convert the in-phase and quadrature-phase (I/Q) data signals to the baseband frequency,
filter the I/Q data signals in the baseband domain to provide filtered baseband I/Q data signals,
up-convert the filtered baseband I/Q data signals to a frequency that is higher than the baseband frequency, and
transmit a radio frequency (RF) signal via a phased array system based upon the filtered baseband I/Q data signals,
wherein the baseband portion and the set of transmit chains are coupled to one another via a coaxial cable over which the set of I/Q data signals are sent.

11. The wireless radio of claim 10, wherein the set of transmit chains are integrated as part of a common radio frequency integrated circuit (RFIC).

12. The wireless radio of claim 10, wherein the frequency that is higher than the baseband frequency to which the filtered baseband I/Q data signals are up-converted is the IF frequency.

13. The wireless radio of claim 10, wherein the frequency that is higher than the baseband frequency to which the filtered baseband I/Q data signals are up-converted is a radio frequency (RF) transmit frequency at which the RF signal is transmitted via the phased array system.

14. The wireless radio of claim 12, wherein the baseband portion is configured to up-convert each one of the set of I/Q data signals from the baseband frequency to the IF frequency using a first IF frequency signal that is generated using an IF reference signal, and
wherein each transmit chain from among the set of transmit chains is configured to up-convert each respective one of the filtered baseband I/Q data signals to the IF frequency using a second IF frequency signal that is generated using the IF reference signal.

15. The wireless radio of claim 13, wherein each transmit chain from among the set of transmit chains is configured to up-convert each respective one of the filtered baseband I/Q data signals to the RF transmit frequency using an RF local oscillator (LO) signal that is generated by a common RF synthesizer.

16. A wireless device, comprising:
processing circuitry configured to up-convert each one of a set of in-phase and quadrature-phase (I/Q) data signals from a baseband frequency to an intermediate frequency (IF); and
a transceiver chain configured to, for each respective one of the I/Q data signals, (i) down-convert the I/Q data signals from the intermediate frequency (IF) to a baseband frequency, (ii) filter the I/Q data signals in the baseband domain to provide filtered baseband I/Q data signals, and (iii) transmit a radio frequency (RF) signal via a phased array system based upon the filtered baseband I/Q data signals,
wherein the processing circuitry and the transceiver chain are coupled to one another via a coaxial cable over which the set of I/Q data signals are sent.

17. The wireless device of claim 16, wherein the processing circuitry is configured to generate the set of I/Q data signals using a first IF frequency signal that is generated using an IF reference signal, and
wherein the transceiver chain is configured to down-convert each respective one of the set of I/Q data signals from the intermediate frequency (IF) to the baseband frequency using a second IF frequency signal that is generated using the IF reference signal.

18. The wireless device of claim 16, wherein the transceiver chain comprises:
a first mixing stage configured to down-convert each respective one of the set of I/Q data signals from the IF frequency to the baseband frequency; and
a second mixing stage configured to up-convert each respective one of the filtered baseband I/Q data signals from the baseband frequency to the IF frequency to generate a set of filtered IF I/Q data signals, and
wherein the transceiver chain is configured to transmit the RF signal via the phased array system based upon the set of filtered IF I/Q data signals.

19. The wireless device of claim 18, wherein the processing circuitry is configured to generate the set of I/Q data signals using a first IF frequency signal that is generated using an IF reference signal, and
wherein the transceiver chain is configured to down-convert each respective one of the I/Q data signals to the baseband frequency in the first mixing stage using a second IF frequency signal that is generated using the IF reference signal, and to up-convert each respective one of the filtered baseband I/Q data signals from the baseband frequency to the IF frequency in the second mixing stage using the second IF frequency signal.

20. The wireless device of claim 16, wherein the transceiver chain comprises:
a first mixing stage configured to down-convert each respective one of the I/Q data signals from the IF to the baseband frequency; and
a second mixing stage configured to up-convert each respective one of the filtered baseband I/Q data signals from the baseband frequency directly to an RF transmit frequency to generate filtered RF I/Q data signals, wherein the transceiver chain is configured to transmit the RF signal via the phased array system based upon the set of filtered RF I/Q data signals.

\* \* \* \* \*